United States Patent
Chen et al.

(10) Patent No.: US 11,411,539 B2
(45) Date of Patent: *Aug. 9, 2022

(54) AMPLIFIER DEVICE

(71) Applicant: RichWave Technology Corp., Taipei (TW)

(72) Inventors: Chih-Sheng Chen, Taipei (TW); Tien-Yun Peng, Taipei (TW); Hung-Chia Lo, Taipei (TW)

(73) Assignee: RichWave Technology Corp., Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/093,504

(22) Filed: Nov. 9, 2020

(65) Prior Publication Data

US 2021/0058037 A1 Feb. 25, 2021

Related U.S. Application Data

(63) Continuation of application No. 16/697,195, filed on Nov. 27, 2019, now Pat. No. 10,873,296, which is a (Continued)

(30) Foreign Application Priority Data

Dec. 30, 2016 (TW) .................. 105144234

(51) Int. Cl.
*H03F 1/02* (2006.01)
*H03F 1/30* (2006.01)
(Continued)

(52) U.S. Cl.
CPC .......... *H03F 1/0222* (2013.01); *H03F 1/302* (2013.01); *H03F 3/213* (2013.01);
(Continued)

(58) Field of Classification Search
CPC ........ H03F 1/0222; H03F 1/302; H03F 3/213; H03F 3/45071; H03F 3/68; H03F 1/3241;
(Continued)

(56) References Cited

U.S. PATENT DOCUMENTS 5,422,522 A 6/1995 Rotay
6,731,171 B2 * 5/2004 Yamashita .............. H03F 1/301
330/285

(Continued)

FOREIGN PATENT DOCUMENTS

CN 1489826 A 4/2004
CN 101610068 A 12/2009
(Continued)

OTHER PUBLICATIONS

Office action dated Feb. 21, 2022 for the Taiwan application No. 109144677, filing date May 7, 2020, pp. 1-4.

*Primary Examiner* — Hieu P Nguyen
(74) *Attorney, Agent, or Firm* — Winston Hsu

(57) ABSTRACT

An amplifier device includes an amplifying unit and a bias module. The amplifying unit has a first end coupled to a voltage source configured to receive a source voltage, a second end configured to receive an input signal, and a third end coupled to a first reference potential terminal configured to receive a first reference potential. The first end of the amplifying unit is configured to output an output signal amplified by the amplifying unit. The bias module is coupled to the second end of the amplifying unit, and configured to receive a voltage signal to generate a bias current according to a first counter-gradient and a second counter-gradient, and provide the bias current to the amplifying unit. The voltage signal is a variable voltage. A supply current flowing into the amplifying unit and is adjusted in accordance with the voltage signal to stay within a predetermined range.

17 Claims, 20 Drawing Sheets

Related U.S. Application Data continuation-in-part of application No. 16/406,026, filed on May 8, 2019, now Pat. No. 10,707,815, which is a continuation-in-part of application No. 15/718,079, filed on Sep. 28, 2017, now Pat. No. 10,326,406.

(51) Int. Cl.
  *H03F 3/213* (2006.01)
  *H03F 3/68* (2006.01)
  *H03F 3/45* (2006.01)
  *H03F 1/56* (2006.01)
  *H03F 1/32* (2006.01)

(52) U.S. Cl.
  CPC ........... *H03F 3/45071* (2013.01); *H03F 3/68* (2013.01); *H03F 1/3241* (2013.01); *H03F 1/56* (2013.01); *H03F 2200/222* (2013.01); *H03F 2200/294* (2013.01); *H03F 2200/451* (2013.01); *H03F 2200/555* (2013.01)

(58) Field of Classification Search
  CPC ................ H03F 1/56; H03F 2200/222; H03F 2200/294; H03F 2200/451; H03F 2200/555; H03F 1/0266; H03F 3/45183; H03F 3/45475
  USPC .......................... 330/285, 296–297, 289, 136
  See application file for complete search history.

(56) References Cited

U.S. PATENT DOCUMENTS

| | | | |
|---|---|---|---|
| 6,838,932 B2 | 1/2005 | Izumiyama | |
| 7,692,490 B2 | 4/2010 | Cho | |
| 8,138,836 B2 | 3/2012 | Matsuzuka | |
| 8,686,795 B2 | 4/2014 | Okamura | |
| 9,219,877 B2 | 12/2015 | Holland | |
| 9,496,830 B1 | 11/2016 | Mays | |
| 10,171,036 B2 * | 1/2019 | Tanaka | H03F 3/21 |
| 2004/0189399 A1 | 9/2004 | Hu | |
| 2007/0024370 A1 | 2/2007 | Hirata | |
| 2009/0072906 A1 | 3/2009 | Tsurumaki | |
| 2009/0251220 A1 | 10/2009 | Matsuda | |
| 2010/0052782 A1 | 3/2010 | Chen | |
| 2012/0146733 A1 | 6/2012 | Matsuzuka | |
| 2013/0076445 A1 | 3/2013 | Kim | |
| 2014/0167859 A1 | 6/2014 | Bettencourt | |
| 2015/0194940 A1 | 7/2015 | Briffa | |
| 2016/0276981 A1 | 9/2016 | Kang | |

FOREIGN PATENT DOCUMENTS

| | | |
|---|---|---|
| CN | 101800518 A | 8/2010 |
| CN | 102647156 A | 8/2012 |
| CN | 103650337 A | 3/2014 |
| CN | 103825558 A | 5/2014 |
| CN | 104218968 A | 12/2014 |
| CN | 105429603 A | 3/2016 |
| EP | 1 727 278 A1 | 11/2006 |
| JP | 2004-297615 A | 10/2004 |
| KR | 10-2014-0000582 A | 1/2014 |
| TW | 201044773 A1 | 12/2010 |
| TW | 201308876 A1 | 2/2013 |
| TW | 201419754 A | 5/2014 |
| TW | I538391 B | 6/2016 |
| TW | 201633698 A | 9/2016 |
| TW | 201838147 A | 10/2018 |
| WO | 2018/001380 A1 | 1/2018 |

* cited by examiner

AMPLIFIER DEVICE

CROSS REFERENCE TO RELATED APPLICATION

This application is a continuation application of application Ser. No. 16/697,195, filed on Nov. 27, 2019, which is a continuation-in-part of application Ser. No. 16/406,026, filed on May 8, 2019, which is a continuation-in-part of application Ser. No. 15/718,079, filed on Sep. 28, 2017, which claims the benefit of Taiwan application No. 105144234, filed on Dec. 30, 2016. The entire contents of the related applications are incorporated herein by reference.

TECHNICAL FIELD

The present disclosure relates to an amplifier device; in particular, to an amplifier device capable of improving linearity.

BACKGROUND

With the prevalence of mobile devices nowadays, amplifier devices are used in communication modules in great quantity. Due to the fact that the power-gain curve and power-phase curve of an amplifier device tend to be non-linear when they reach a certain level, amplifier devices are limited in power usage. Though the approaches of reducing the power or introducing a pre-distortion circuit may be utilized, the complexity of circuit design and cost would increase correspondingly. Moreover, the linearity of an amplifier device varies according to the input signal, voltage source or temperature, so that if a pre-distortion circuit is utilized as previously described, different control factors need thus be considered, and the circuit design would also become more complicated.

Therefore, providing an amplifier device with simple circuit and capable of self-adjusting linearity becomes a critical issue.

SUMMARY

According to one embodiment, an amplifier device includes an amplifying unit and a bias module. The amplifying unit has a first end coupled to a voltage source configured to receive a source voltage, a second end configured to receive an input signal, and a third end coupled to a first reference potential terminal configured to receive a first reference potential. The first end of the amplifying unit is configured to output an output signal amplified by the amplifying unit. The bias module is coupled to the second end of the amplifying unit, and configured to receive a voltage signal to generate a bias current according to a first counter-gradient and a second counter-gradient, and provide the bias current to the amplifying unit. The voltage signal is a variable voltage substantially positively correlated to the source voltage. The first counter-gradient and the second counter-gradient are negatively correlated to the voltage signal. A supply current flowing into the amplifying unit is adjusted in accordance with the voltage signal to stay within a predetermined range. When the source voltage is less than a predetermined value, a relationship between the supply current and the source voltage is approximated by a first line segment. When the source voltage is greater than the predetermined value, the relationship between the supply current and the source voltage is approximated by a second line segment. The first line segment has a first gradient. The second line segment has a second gradient. The first counter-gradient is negatively correlated to the first gradient. The second counter-gradient is negatively correlated to the second gradient.

According to another embodiment, an amplifier device includes an amplifying unit and a bias module. The amplifying unit has a first end coupled to a voltage source configured to receive a source voltage, a second end configured to receive an input signal, and a third end coupled to a first reference potential terminal configured to receive a first reference potential. The first end of the amplifying unit is configured to output an output signal amplified by the amplifying unit. The bias module is coupled to the second end of the amplifying unit, is used to receive a voltage signal to provide a bias current to the amplifying unit, and includes a variable current source, a first transistor, a fifteenth resistor, a first diode and a second diode. The first transistor includes a first end coupled to a bias voltage source, a second end, and a third end coupled to the second end of the amplifying unit. The fifteenth resistor includes a first end coupled to the variable current source, and a second end coupled to the second end of the first transistor. The first diode includes a first end coupled to the second end of the fifteenth resistor, and a second end. The second diode includes a first end coupled to the second end of the first diode, and the second end coupled to a fourth reference potential terminal. The voltage signal is a variable voltage. A supply current flowing into the amplifying unit is adjusted in accordance with the voltage signal to stay within a predetermined range.

According to another embodiment, an amplifier device includes an amplifying unit and a bias module. The amplifying unit has a first end coupled to a voltage source configured to receive a source voltage, a second end configured to receive an input signal, and a third end coupled to a first reference potential terminal configured to receive a first reference potential. The first end of the amplifying unit is configured to output an output signal amplified by the amplifying unit. The bias module is coupled to the second end of the amplifying unit, is used to receive a voltage signal to provide a bias current to the amplifying unit, and includes a variable current source, a first transistor, a sixteenth resistor, a seventeenth resistor and a second transistor. The first transistor includes a first end coupled to a bias voltage source, a second end, and a third end coupled to the second end of the amplifying unit. The sixteenth resistor includes a first end coupled to the variable current source, and a second end coupled to the second end of the first transistor. The seventeenth resistor includes a first end, and a second end coupled to the third end of the first transistor. The second transistor includes a first end coupled to the second end of the sixteenth resistor, a second end coupled to the first end of the seventeenth resistor, and a third end coupled to a fifth reference potential terminal. The voltage signal is a variable voltage. A supply current flowing into the amplifying unit is adjusted in accordance with the voltage signal to stay within a predetermined range.

DETAILED DESCRIPTION

Figure 1:
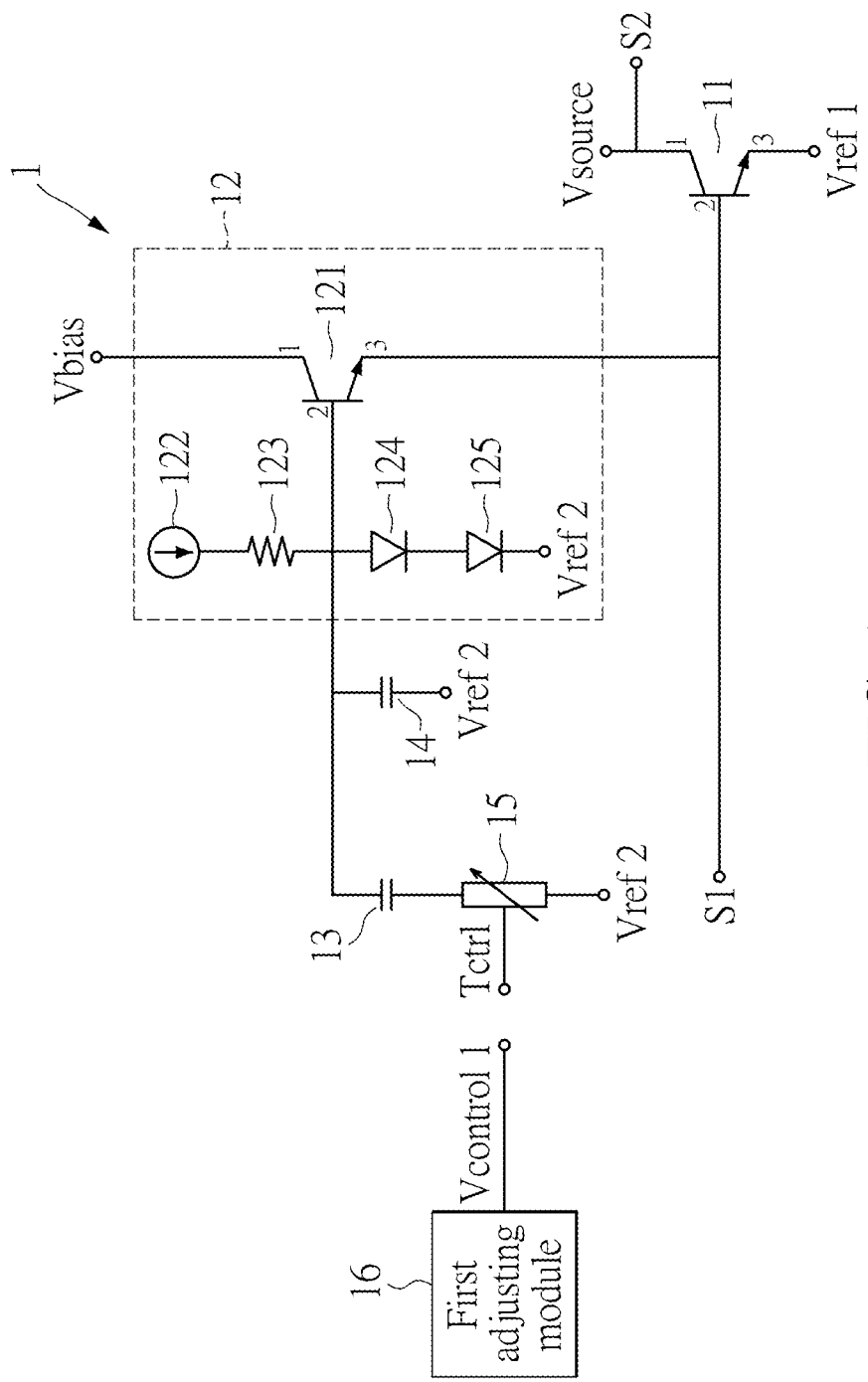
FIG. 1 shows a diagram of an amplifier device according to an embodiment of the present disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 2:
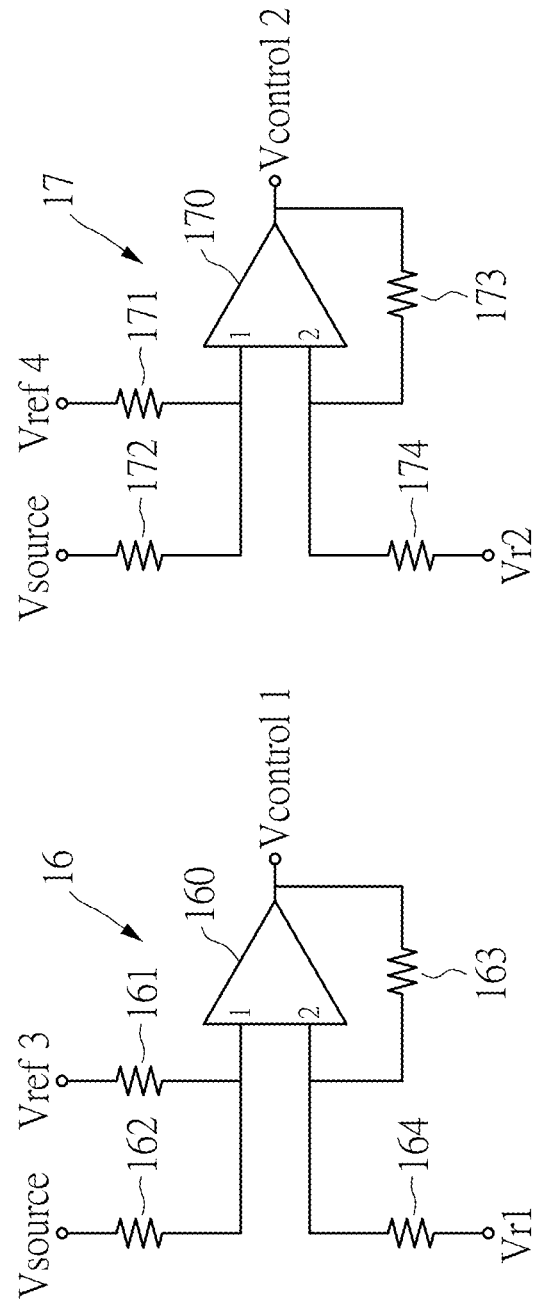
FIG. 2 shows a diagram of a first adjusting module and a second adjusting module according to an embodiment of the present disclosure.
Figure 3A:
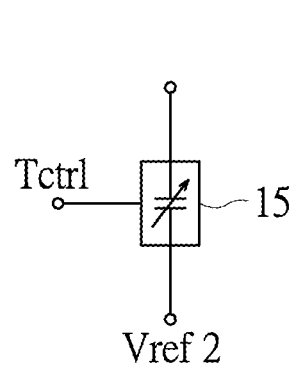
FIGS. 3A-3Y show diagrams of an impedance unit implemented by different elements according to the embodiments of the present disclosure.
Figure 3B:
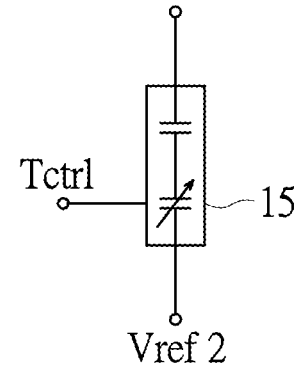
Figure 3C:
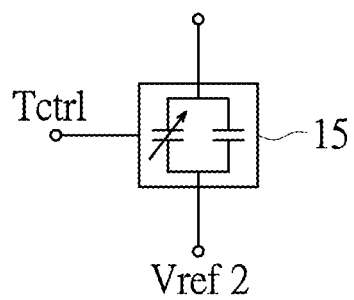
Figure 3D:
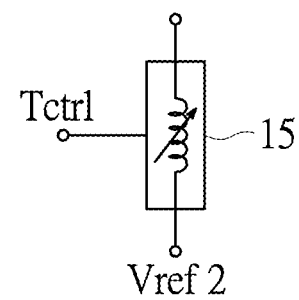
Figure 3E:
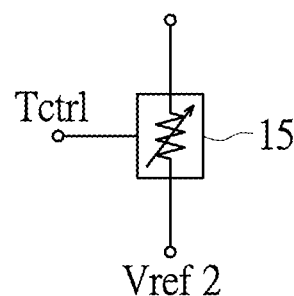
Figure 3F:
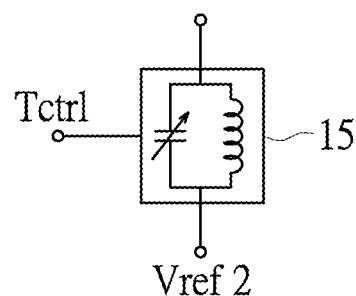
Figure 3G:
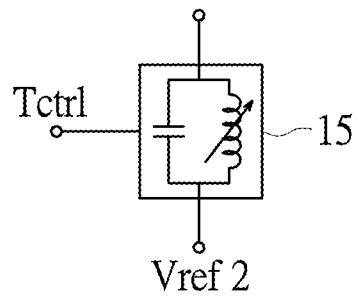
Figure 3H:
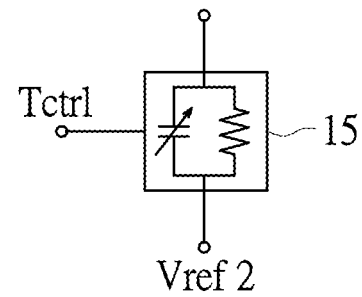
Figure 3I:
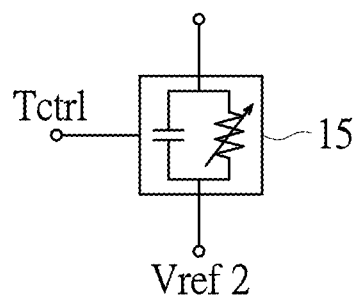
Figure 3J:
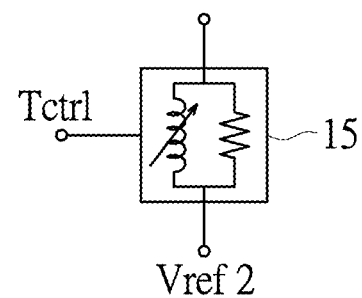
Figure 3K:
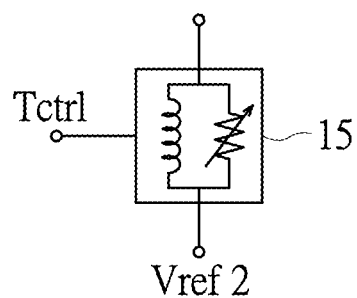
Figure 3L:
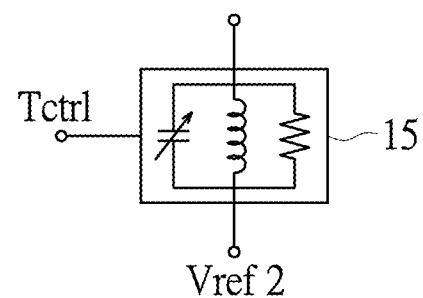
Figure 3M:
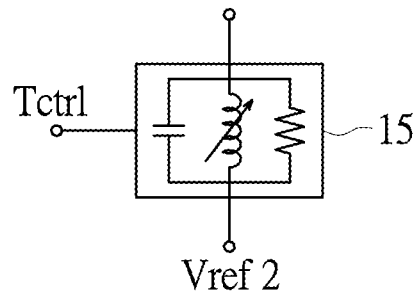
Figure 3N:
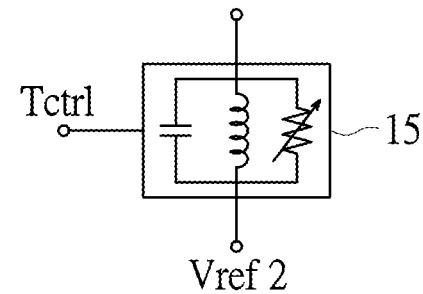
Figure 3O:
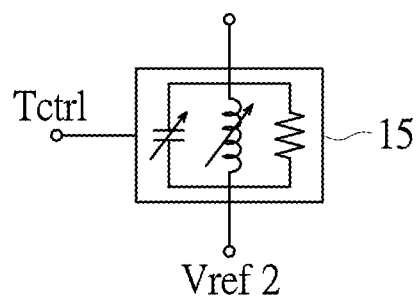
Figure 3P:
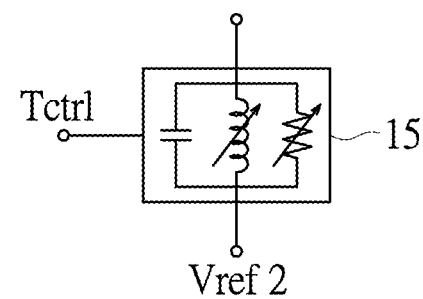
Figure 3Q:
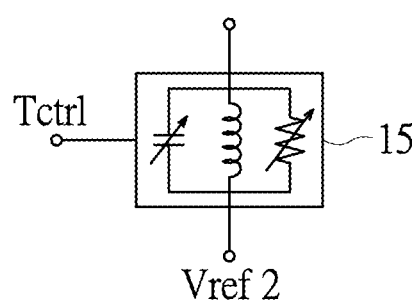
Figure 3R:
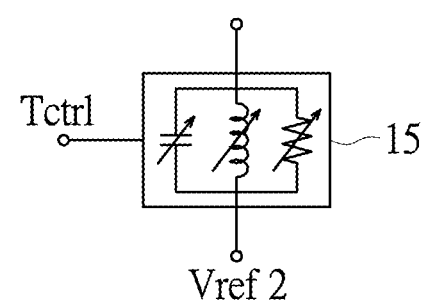
Figure 3S:
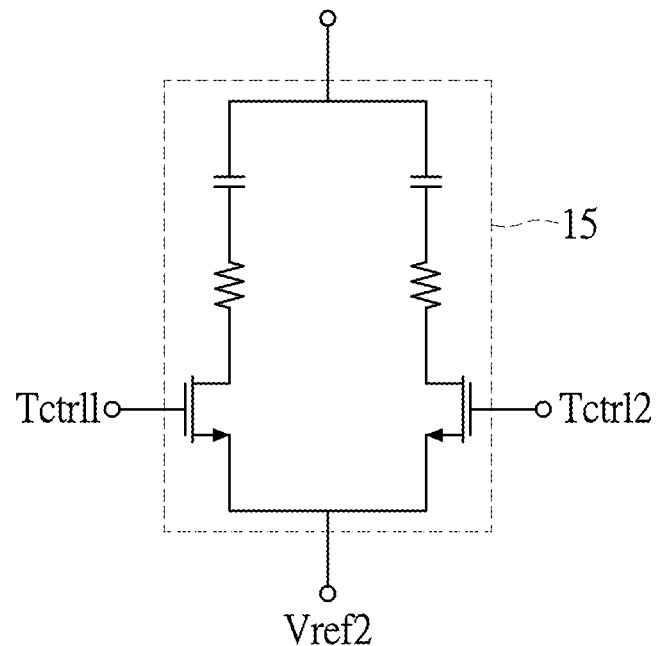
Figure 3T:
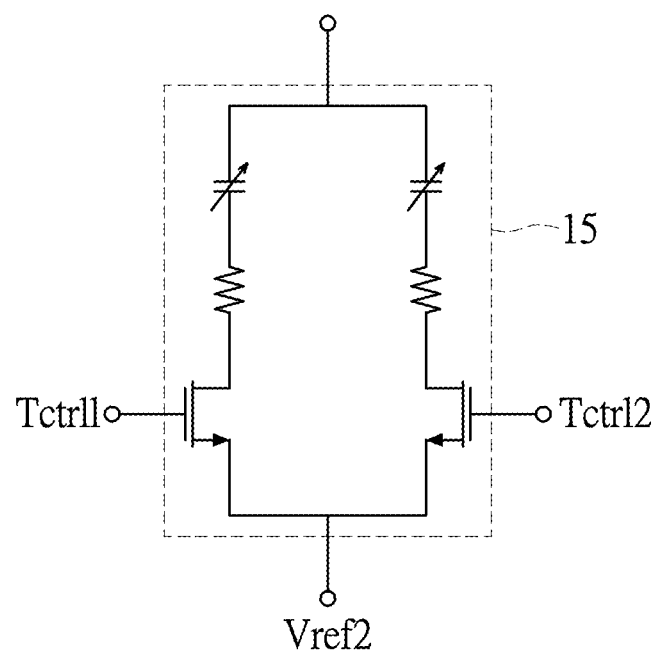
Figure 3U:
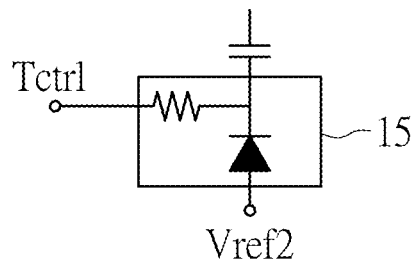
Figure 3V:
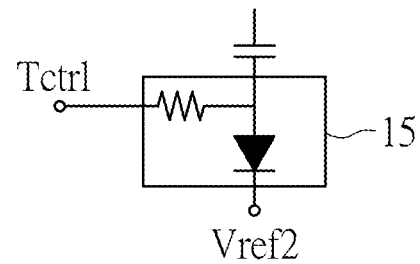
Figure 3W:
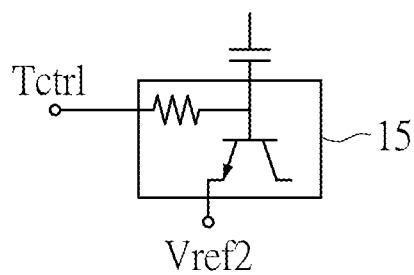
Figure 3X:
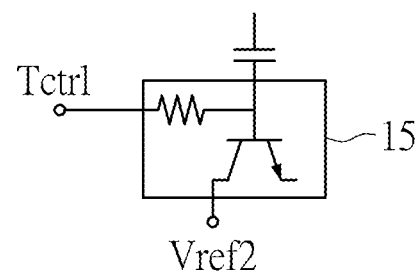
Figure 3Y:
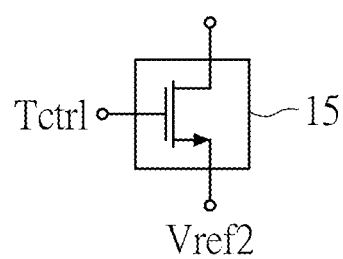

Reference is made to FIG. 1, FIG. 2 and FIGS. 3A-3Y, where FIG. 1 shows a diagram of an amplifier device according to an embodiment of the present disclosure, FIG. 2 shows a diagram of a first adjusting module and a second adjusting module according to an embodiment of the present disclosure, and FIGS. 3A-3Y show diagrams of an impedance unit implemented by different elements according to the embodiments of the present disclosure.

In the following description, for the sake of brevity, for elements with two ends in FIG. 1 and FIG. 2, the upper end would be the first end and the lower end would be the second end if an element is placed vertically, and the left end would be the first end and the right end would be the second end if an element is placed horizontally. For elements with three or more ends in FIG. 1 and FIG. 2, reference in the description would be made according to the end number as labeled in the figures.

The amplifier device 1 includes an amplifying unit 11 and a bias module 12. The amplifying unit 11 includes a first end, a second end and a third end. The first end of the amplifying unit 11 connects to a voltage source Vsource, the second end of the amplifying unit 11 receives an input signal S1, the first end of the amplifying unit 11 is configured for outputting an output signal S2 amplified by the amplifying unit, the third end of the amplifying unit 11 connects to a first reference potential Vref1. In the present embodiment, the amplifying unit 11 may be a bipolar junction transistor (BJT), and the voltage source Vsource is provided by a battery, with the voltage value being variable, e.g., time-varying. The amplifier device 1 may be installed in a mobile device (not shown in the figures), and may use the battery of the mobile device to provide the voltage source Vsource. The amplifier device 1 may be, such as, a power amplifier or a low noise amplifier, and a power amplifier is taken as exemplary in the present embodiment. Moreover, the input signal S1 and the output signal S2 may be AC signal, such as radio frequency (RF) signal.

The bias module 12 includes a power element 121, a reference power module 122, a first bias element 123, a second bias element 124 and a third bias element 125. The power element 121 has a first end, a second end and a third end. The first end of the power element 121 electrically connects to a bias voltage source Vbias, the third end of the power element 121 connects to the second end of the amplifying unit 11. The bias module 12 adjusts a linearity of the amplifier device 1 according to a frequency value of the input signal S1, a voltage value of the voltage source Vsource or a temperature value of the amplifier device 1. In the present embodiment, the bias voltage source Vbias and the voltage source Vsource may or may not have the same potential, and is not limited to either circumstance by the present disclosure.

The first bias element 123 has a first end and a second end. The first end of the first bias element 123 electrically connects to the reference power module 122, the second end of the first bias element 123 electrically connects to the second end of the power element 121. The second bias element 124 has a first end and a second end, and the first end of the second bias element 124 electrically connects to the second end of the first bias element 123. In the present embodiment, the reference power module 122 is a current source which provides a reference current to the first bias element 123 of the bias module 12. In other embodiments the reference power module 122 may be a voltage source or power modules with other kinds of power supplying.

The third bias element 125 has a first end and a second end, the first end of the third bias element 125 electrically connects to the second end of the second bias element 124, the second end of the third bias element 125 electrically connects to a second reference potential Vref2 or other reference potentials, and is not limited by the present disclosure.

In the present embodiment, the amplifier device 1 further includes a first default capacitor 13, a second default capacitor 14, an impedance unit 15 and a first adjusting module 16, so as to adjust the linearity of the amplifier device 1.

The first default capacitor 13 has a first end and a second end, and the first end of the first default capacitor 13 electrically connects to the bias module 12. In the present embodiment, the first end of the first default capacitor 13 electrically connects to the second end of the power element 121, the second end of the first bias element 123 and the first end of the second bias element 124. The second end of the first default capacitor 13 connects to the impedance unit 15. The first default capacitor 13 can be used to block DC (direct current) signal.

The second default capacitor 14 has a first end and a second end. The first end of the second default capacitor 14 connects to the first end of the first default capacitor 13, and the second end of the second default capacitor 14 electrically connects to the second reference potential Vref2. The second default capacitor 14 can be used to block DC (direct current) signal.

In the present embodiment, the power element 121 may be, such as a bipolar junction transistor (BJT), the first element 123 is a resistor, and the second bias element 124 and the third bias element 125 are respectively a diode. In the present embodiment, the second bias element 124 and the third bias element 125 may be, but not limited to, a diode composed of a p-type semiconductor or an n-type semiconductor, e.g., a diode composed of bipolar junction transistor (BJT). In other embodiments, the second bias element 124 and the third bias element 125 may be other elements, or be replaced by equivalent circuit such as a metal-oxide-semiconductor field-effect transistor (MOSFET).

In the present embodiment, since the bias module 12, the second default capacitor 14 and the impedance 15 are often disposed in the same vicinity in circuit design, the second default capacitor 14, the impedance unit 15 and the third bias element 125 may be all electrically connected to the second reference potential Vref2 as a common reference potential. In the present embodiment, the first reference potential Vref1 and the second reference potential Vref2 may be, but are not limited to, a ground potential or other reference potentials. Moreover, in the present embodiment, the reference power module 122 may be a variable current source, a constant voltage source or a variable voltage source, and current value of a reference current provided by the variable current source or voltage value of a reference voltage provided the variable voltage source may be adjusted according to a frequency value of the input signal S1, the voltage value of the voltage source Vsource or a temperature value of the amplifier device 1, so as to adjust the bias voltage provided by the bias module 12 to the amplifying unit 11. Comparing to the amplifier device that only has the amplifying unit 11 and the bias module 12, the second capacitor 14 can be used to change the impedance viewed from the second end of the power element 121 to the external, such as the impedance to the AC signal, and the first default capacitor 13 and the impedance unit 15 can be further used to dynamically adjust the impedance viewed from the second end of the power element 121 to the external of the power element 121.

In the present embodiment, the impedance value of the impedance unit 15 is variable, and by serially connecting the impedance unit 15 with the first default capacitor 13, the equivalent impedance resulted from the first default capacitor 13 and the impedance unit 15 can be adjusted. In the present embodiment, the impedance unit 15 may be a variable resistor, a variable capacitor, a variable inductor, a switch or other equivalent circuit or electronic device capable of adjusting impedance value, such as a varactor, or the combination of the above-mentioned elements. The impedance unit 15 further includes an impedance control end Tctr1, which may receive a control signal. In the present embodiment, the amplifier device 1 further includes a first adjusting module 16, configured to provide a first adjusting signal (e.g., the first adjusting voltage Vcontrol1) to the control end Tctr1 of the impedance unit 15, for adjusting the impedance value of the impedance unit 15. In other embodiments, the impedance value of the impedance unit 15 may be adjusted according to a frequency value of the input signal S1, the voltage value of the voltage source Vsource or the temperature value of the amplifier device 1.

The first adjusting module 16 includes a first amplifier 160, a first resistor 161, a second resistor 162, a third resistor 163 and a fourth resistor 164. The first amplifier 160 has a first input end, a second input end and an output end. The first resistor 161 is connected between the first end of the first amplifier 160 and a third reference potential Vref3. The second resistor 162 connects the first input end of the first amplifier 160 and the voltage source Vsource. The third resistor 163 is connected between the second input end of the first amplifier 160 and the output end of the first amplifier 160. The fourth resistor 164 is connected between the first reference voltage Vr1 and the second input end of the first amplifier 160. In the present embodiment, the output end of the first amplifier 160 of the first adjusting module 16 outputs a first adjusting voltage Vcontrol1 to adjust impedance value of the impedance unit 15, i.e., the output end of the first amplifier 160 of the first adjusting module 16 electrically connects to the control end Tctr1 of the impedance unit 15. In the present embodiment, the third reference potential Vref3 is a ground potential, i.e., 0V. In other embodiments, the third reference voltage Vref3 may be other reference potentials.

In the present embodiment, the first adjusting module is a differential amplifier architecture, thus the first adjusting voltage Vcontrol1 may be calculated and obtained according to the voltage value of the voltage source, the first reference voltage Vr1, the third reference potential Vref3, the impedance value of the first resistor 161, the impedance value of the second resistor 162, the impedance value of the third resistor 163 and the impedance value of the fourth resistor 164. In the present embodiment, the third reference potential Vref3 is 0V, and thus the first adjusting voltage Vcontrol1 may be represented by the following equation 1:

$$Vcontrol1 = \frac{R1}{R1+R2} * \left(1 + \frac{R3}{R4}\right) * Vsource - \frac{R3}{R4} * Vr1 \qquad \text{Equation 1}$$

In the equation above, R1 is the impedance value of the first resistor 161, R2 is the impedance value of the second resistor 162, R3 is the impedance value of the third resistor 163 and R4 is the impedance value of the fourth resistor 164. Vcontrol1 represents the first adjusting voltage and Vr1 represents the first reference voltage.

According to equation 1, if the impedance value of the first resistor 161 equals to the impedance value of the third resistor 163 and the impedance value of the second resistor 162 equals to the impedance value of the fourth resistor 164, equation 1 may be simplified to equation 2:

$$Vcontrol1 = (Vsource - Vr1) * \left(\frac{R1}{R2}\right) \qquad \text{Equation 2}$$

In the present embodiment, the first reference voltage Vr1 is a constant, with only the voltage value of the voltage source being variable, and the impedance values of each resistor are also constant, which means that the first adjusting voltage Vcontrol1 is a function value of the voltage source Vsource. In other embodiments, other kinds of circuit may be utilized for the design of the first adjusting voltage Vcontrol1, so long as the voltage source Vsource is the main variable of the first adjusting voltage Vcontrol1.

In the present embodiment, the impedance value of the impedance unit 15 is adjusted according the voltage value of the voltage source Vsource, which means, based on the voltage value of the voltage source Vsource, adjusting the equivalent impedance seen from the third end of the power element 121 to the internal of the power element 121, and further adjusting the bias voltage provided by the bias module 12 to the amplifying unit 11. In other embodiments, the impedance value of the impedance unit 15 may be adjusted according to the a frequency value of the input signal S1 or other parameters, so as to further adjust the bias voltage provided by the bias module 12 to the amplifying unit 11. For example, a frequency-voltage conversion circuit may first be used to detect the frequency of an input signal, the frequency is then converted into a voltage value, and then the impedance value of the impedance unit 15 may be adjusted by using the voltage value. In other embodiments, the amplifier device 1 may include a temperature sensor (not shown in the figures) for detecting the temperature of the amplifier device 1. The impedance value of the impedance unit 15 may be adjusted according to the temperature of the amplifier device 1, so as to further adjust the bias voltage provided by the bias module 12 to the amplifying unit 11. In summary, in the embodiments of the present disclosure, the equivalent impedance seen from the third end of the power element 121 to the internal of the power element 121 may be adjusted according to the voltage value of the voltage source Vsource, a frequency value of the input signal S1 and the temperature of the amplifier device 1.

In the present embodiment, the first adjusting module 16, based on the variation of the voltage source Vsource, adjusts the impedance value of the impedance unit 15. Therefore, the impedance seen outwardly from the second end of the power element 121 of the bias module 12 may be adjusted, which effects the equivalent impedance seen from the third end of the power element 121 to the internal of the power element 121, further adjusts the bias voltage provided bias module 12 to the amplifying unit, and effects the linearity of the power-gain curve or the power-phase curve of the amplifying unit 11.

In the present embodiment, the impedance unit 15 may be that shown by the diagrams in FIGS. 3A-3Y, and may be, but not limited to, designed by using different resistors, capacitors, inductors, variable resistors, variable capacitors, variable inductors, switch elements (e.g., transistors or diodes), or the combination thereof

[Embodiment of Amplifier Device with Two Adjusting Modules]

In the present embodiment, the amplifier device 1 further includes a second adjusting module 17. The second adjusting module 17 includes a second amplifier 170, a fifth resistor 171, a sixth resistor 172, a seventh resistor 173 and an eighth resistor 174. The second amplifier 170 has a first input end, a second input end and an output end. The fifth resistor 171 is connected between the first input end of the second amplifier 170 and a fourth reference potential Vref4. The sixth resistor 172 is connected between the first input end of the second amplifier 170 and the voltage source Vsource. The seventh resistor 173 is connected between the second input end of the second amplifier 170 and the output end of the second amplifier 170. The eighth resistor is connected between a second reference voltage Vr2 and the second input end of the second amplifier 170.

In the present embodiment, the varying interval of the voltage source Vsource is divided into two intervals, which means that the voltage source Vsource has a first voltage interval and a second voltage interval. When the voltage value of the voltage source Vsource is within the first voltage interval, the first adjusting module 16 provides a first adjusting voltage to adjust the impedance value of the impedance unit 15, and when the voltage value of the voltage source Vsource is within the second voltage interval, the second adjusting module 17 provides a second adjusting signal (e.g., a second adjusting voltage) to adjust the impedance value of the impedance unit 15. In the present embodiment, both the output end of the first amplifier 160 of the first adjusting module 16 and the output end of the second amplifier 170 of the second adjusting module 170 electrically connect to the control end Tctr1 of the impedance unit 15. In other embodiments, a user may set the first reference voltage Vr1 and the second reference voltage Vr2 for the setting of the first voltage interval and the second voltage interval. In the present embodiment, the first adjusting voltage Vcontrol1 and the second adjusting voltage Vcontrol2, as described in the previous paragraph, are both a function value of the voltage source Vsource. In other embodiments, other circuits may be utilized for the design of the first adjusting voltage Vcontrol1 and the second adjusting voltage Vcontrol2, so long as the voltage source Vsource is the main variable of the first adjusting voltage Vcontrol1 and the second adjusting voltage Vcontrol2, the designs thereof not being limited to the above description.

In the present embodiment, the third reference potential Vref3 and the fourth reference potential Vref4 may be, but not limited to, a ground potential or other reference potentials.

In other embodiments, the first adjusting voltage Vcontrol1 of the first adjusting module 16 may electrically connect to the first impedance control end Tctrl1 as shown in FIG. 3S or FIG. 3T, the second adjusting voltage Vcontrol2 may electrically connect to the second impedance control and Tctrl2 as shown in FIG. 3S or FIG. 3T. A designer, by different practical demands, and according to the resistor-capacitor combination as shown in FIG. 3S or FIG. 3T, may select different resistances or capacitances to generate different equivalent impedances.

In other embodiments, the voltage-varying interval of the voltage source Vsource may be divided into more intervals, and the number of the adjusting modules should be increased accordingly to provide adjusting voltages.

Figure 4:
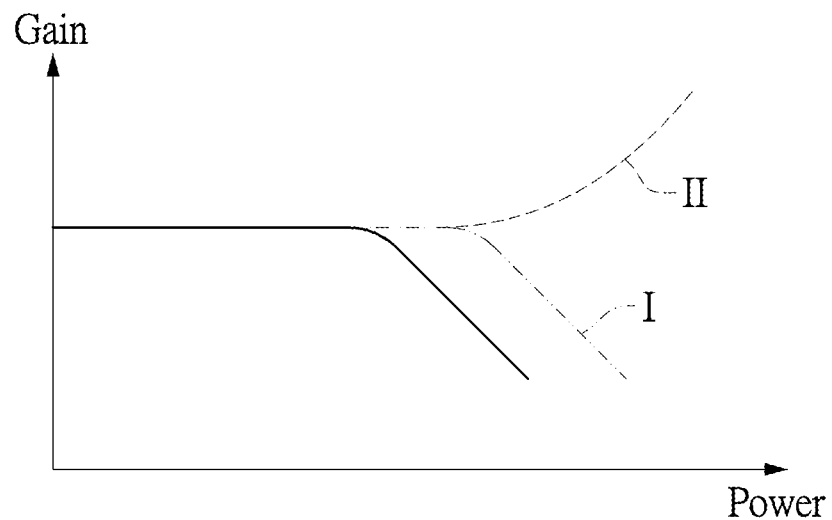
FIG. 4 shows a diagram of a power-gain curve of an amplifier device.
Figure 5:
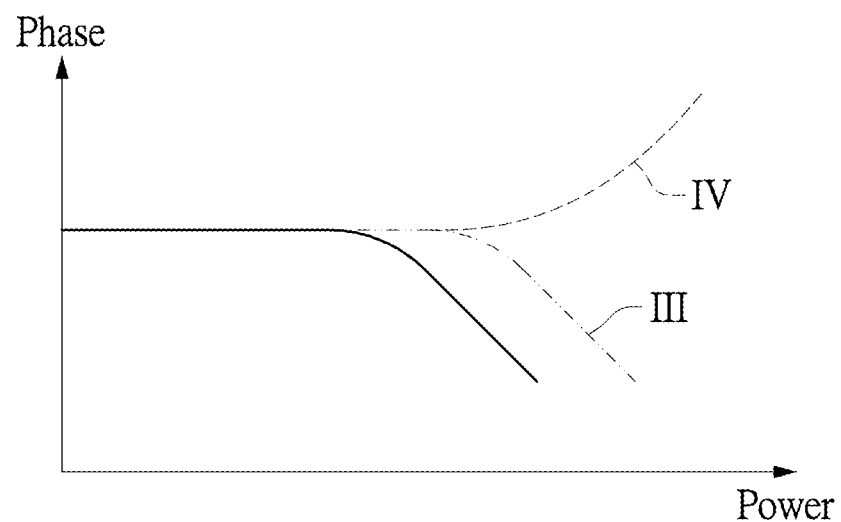
FIG. 5 shows a diagram of a power-phase curve of an amplifier device.

Reference is made to FIG. 4 and FIG. 5, where FIG. 4 shows a diagram of a power-gain curve of an amplifier device and FIG. 5 shows a diagram of a power-phase curve of an amplifier device.

The solid line as shown in FIG. 4 is the power-gain curve of an uncompensated amplifier device. In general, when the power of an uncompensated amplifier device exceeds a predetermined value, the gain curve extends downwardly and nonlinearly as shown in FIG. 4. After that, if a pre-distortion circuit or other compensation circuit is introduced, it would be shown as the dotted line I and the dotted line II in FIG. 4, where the dotted line I represents the gain linear area being drawn to higher power after the amplifier device is bias compensated, and when under higher power, the gain curve extends downwardly. The dotted line II represents, after the amplifier device is bias compensated, the linear area of the adjusted gain curve being not only drawn further, but also extended upwardly according to practical demand.

The solid line as shown in FIG. 5 is the power-phase curve of an amplifier device not being bias compensated. As shown in FIG. 5, when the power is lower, the power-phase curve extends linearly, when the power increases to a predetermined value however, the power-phase curve starts to extend downwardly, and distortion occurs at the output end of the amplifier device. The dotted line III and the dotted line IV in FIG. 5 are the power-phase curve adjusted according to different demands of the amplifier device 1 according to an embodiment of the present disclosure. Therefore, a user may compensate the linearity of the amplifier device 1 according to different factors, so as to increase the linearity of the amplifier device 1 effectively.

Figure 6:
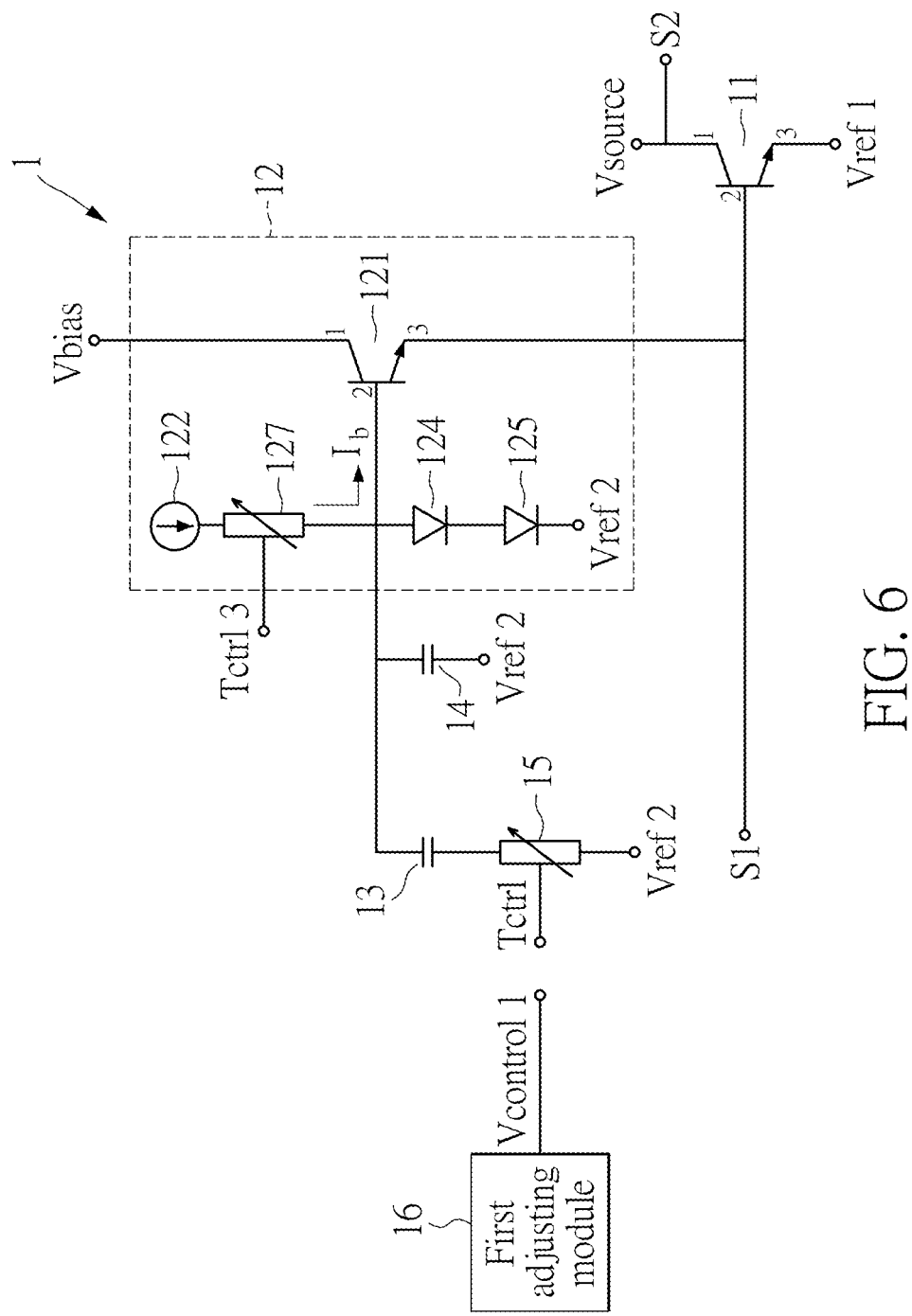
FIG. 6 shows a diagram of an amplifier device according to another embodiment of the present disclosure.

Reference is made to FIG. 6, which shows a diagram of an amplifier device according to another embodiment of the present disclosure. In the present embodiment, the amplifier device 1 as shown in FIG. 6 is similar to the amplifier device 1 as shown in FIG. 1, one of the differences is that the first bias element 123 of the amplifier device 1 of FIG. 1 is replaced by a first bias element 127. In the present embodiment, the first bias element 127 may be a variable resistor. The first bias element 127 has a third control end Tctrl3 electrically connected with the first adjusting module 16. Furthermore, in the present embodiment, the voltage source Vsource may have a constant voltage value.

In the present embodiment, when the power of the input signal S1 and the output signal S2 are changed, or the operation mode of the amplifying unit 11 is adjusted between a high power operation mode and a low power operation mode, a variable current $I_b$, which flows into the second end of the power element 121 of the bias module 12 through the first bias element 127 from the reference power module 122 would be changed. For example, when the operation mode of the amplifying unit 11 is adjusted from the high power operation mode to the low power operation mode, the variable current $I_b$ would be decreased. In the meantime, the impedance value of the impedance unit 15 will be adjusted simultaneously in accordance with the corresponding linearity. Therefore, in the present embodiment, the linearity of the frequency-phase curve can be adjusted accordingly. That is to say, in the present embodiment, the variable current of the first bias element 127 and the impedance value of the impedance unit 15 are taken as the main factors of the first adjusted voltage Vcontrol1.

Therefore, in the present embodiment, the first adjusting module 16 can, according to the power of the input signal S1 and the output signal S2 or the operation mode of the amplifier device, output a first adjusting voltage Vcontrol1, and by adjusting the impedance value of the impedance unit 15 over the first control end Tctrl1 and the third control end Tctrl3, and by the variable current $I_b$ flows through the first bias element 127, the linearity of the amplifier device 1 can be adjusted.

In other embodiments such as shown in FIG. 3Y, the impedance unit 15 includes a switch element. When the operation mode of the amplifying unit 11 is changed (e.g., the operation mode of the amplifying unit 11 is adjusted between a high power operation mode and a low power operation mode), the first adjusting module 16 can, according to the operation mode of the amplifier device, outputs the first adjusting voltage Vcontrol1 corresponding to the operation mode, by controlling the switch element of the impedance unit 15 to be connected or disconnected through the first control end Tctrl1 and the third control end Tctrl3, and the variable current $I_b$ passing through the first bias element 127, an impedance value matching the operation mode can be provided, which further improves the linearity of the amplifier device.

Figure 7:
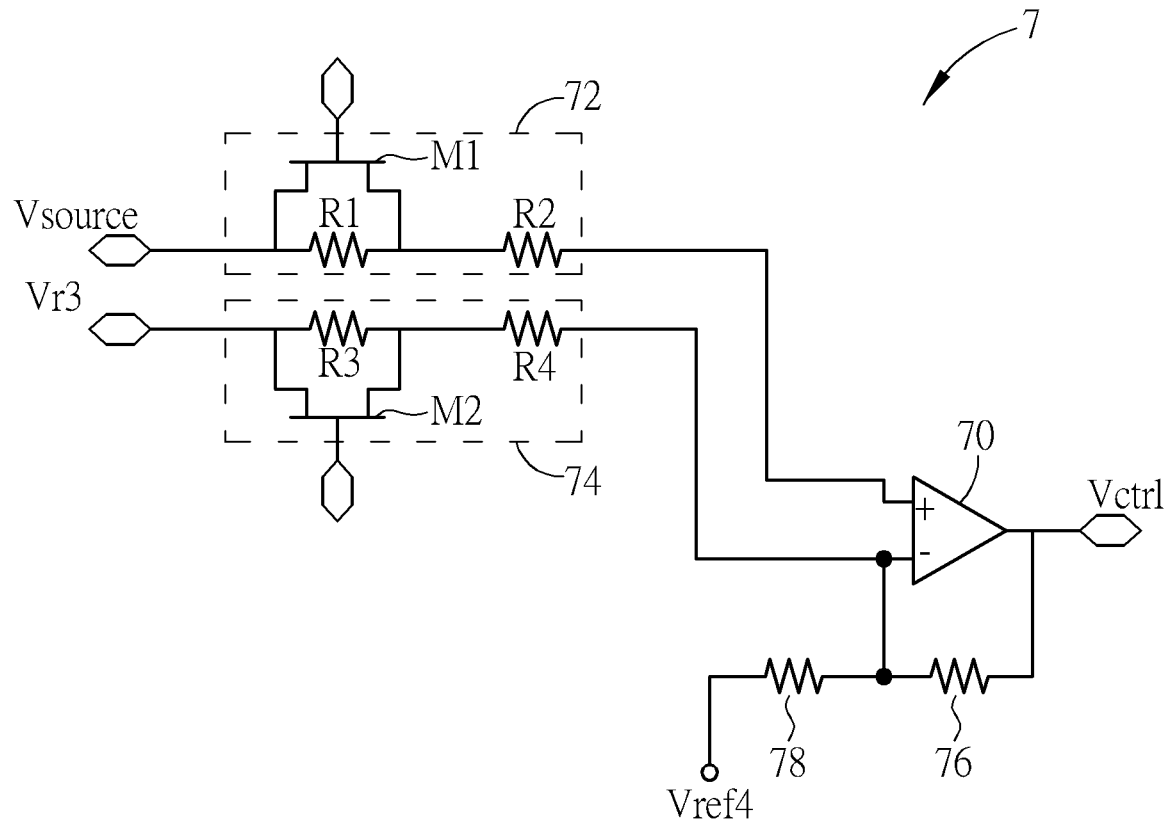
FIG. 7 is a circuit schematic of a first adjustment module for use in the amplifier device 1 in FIG. 1.

FIG. 7 is a circuit schematic of a first adjustment module 7 for use in the amplifier device 1 in FIG. 1. The first adjustment module 7 may compensate for a variation in a source voltage Vsource from the voltage source over time. Further, the first adjustment module 7 may compensate for a source voltage Vsource having multiple variations. For example, the first adjustment module 7 may adaptively compensate for a first variation of a source voltage Vsource increasing at a first rate and for a second variation of the source voltage Vsource increasing at a second rate. In particular, the first adjustment module 7 may compensate for the variation in the source voltage Vsource by generating a control voltage Vctrl correlated with the source voltage Vsource and adjusting the impedance unit 15 using the control voltage Vctrl. An adjustment of the impedance unit 15 may result in an adjustment of an input impedance looked out from the second end of the amplifying unit 11 to the bias module 12 and modification of a bias voltage to the amplifying unit 11, thereby compensating for any voltage shift of the source voltage Vsource over time.

Figure 8:
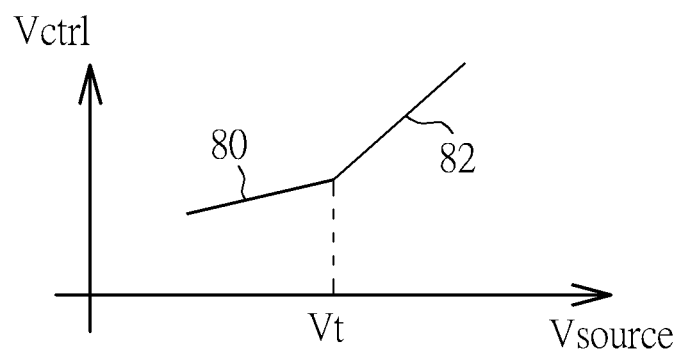
FIG. 8 depicts a positively correlated relationship between the control voltage and the source voltage.

The first adjustment module 7 comprises a first amplifier 70, a first resistance selection circuit 72, a second resistance selection circuit 74, a first feedback resistor 76 and a second feedback resistor 78. The first amplifier 70 may be an operational amplifier having a first input end, a second input end and an output end, with the first input end being a non-inverting end, the second input end being an inverting end, and the output end outputting the control voltage Vctrl according to the source voltage Vsource and a first reference voltage Vr3 to adjust the impedance value of the impedance unit. In some embodiments, it is desirable to generate a control voltage Vctrl positively correlated with the source voltage Vsource to compensate for changes in source voltage Vsource during operations of the amplifying unit 11. FIG. 8 depicts a positively correlated relationship between the control voltage Vctrl and the source voltage Vsource. In such a case, the first resistance selection circuit 72 is electrically connected between the source voltage having the source voltage Vsource and the first input end of the first amplifier 70, and the second resistance selection circuit 74 is electrically connected between a first reference voltage terminal having the first reference voltage Vr3 and the second input end of the first amplifier 70. The first reference voltage Vr3 may be a bandgap reference voltage that is independent of voltage source variations. The first feedback resistor 76 is electrically connected between the second input end of the first amplifier 70 and the output end of the first amplifier 70. The second feedback resistor 78 is electrically connected between the second input end of the first amplifier 70 and the first reference potential Vref4. The first reference potential Vref4 may be a ground reference potential. The resistance Res_RF of the second feedback resistor 78 may be set to a multiple of the resistance Res_RF1 of the first feedback resistor 76 to modify the slope of the line segments 80 and 82 in FIG. 8. In one embodiment, the first feedback resistor 76 and the second feedback resistor 78 may have substantially identical resistance.

As illustrated in FIG. 8, the source voltage Vsource may change at a first rate when the source voltage Vsource is less than a threshold value Vt such as 4.5V, and change at a second rate when the source voltage Vsource exceeds the threshold value Vt, and subsequently, in FIG. 7, the first resistance selection circuit 72 and the second resistance selection circuit 74 may be configured to generate the control voltage Vctr1 to compensate for both the first and second rates of changes in the source voltage Vsource. Specifically, the first resistance selection circuit 72 comprises a first transistor M1, a resistor R1 and a resistor R2. The first transistor M1 comprises a first end, a second end and a control end, the first end of the first transistor M1 is electrically connected to the voltage source having the source voltage Vsource, and the control end of the first transistor M1 is configured to control an electrical connection between the first end and the second end of the first transistor M1 according to the source voltage Vsource. The resistor R1 is electrically connected between the first end and the second end of the first transistor M1. The resistor R2 is electrically connected between the second end of the first transistor M1 and the first input end of the first amplifier 70, that is, the resistor R2 is electrically connected serially with the first transistor M1. The second resistance selection circuit 74 comprises a second transistor M2, a resistor R3 and a resistor R4. The second transistor M2 comprises a first end, a second end and a control end, the first end of the second transistor M2 is electrically connected to the first reference voltage terminal having the first reference voltage Vr3, and the control end of the second transistor M2 is configured to control an electrical connection between the first end and the second end of the second transistor M2 according to the source voltage Vsource. The resistor R3 is electrically connected between the first end and the second end of the second transistor M2. The resistor R4 is electrically connected between the second end of the second transistor M2 and the second input end of the first amplifier 70, that is, the resistor R4 is electrically connected serially with the second transistor M2. In another embodiment, the resistor R2 could be moved and electrically connected between the resistor R1 and the voltage source, and/or the resistor R4 could be moved and electrically connected between the resistor R3 and the first reference voltage terminal having the first reference voltage Vr3. In one embodiment, the resistor R1 and the resistor R3 have substantially identical resistance, and the resistor R2 and the resistor R4 have substantially identical resistance. The control voltage Vctr1 can be expressed by Equation 3:

$$Vctr1 = k1 * (Vsource - Vr3) \quad \text{Equation 3}$$

where Vr3 is the first reference voltage;
Vsource is the source voltage;
k1=Res_RF/(Res1+Res2)=Res_RF/(Res3+Res4) when the first transistor M1 and the second transistor M2 are turned off;
k1=Res_RF/Res2=Res_RF/Res4 when the first transistor M1 and the second transistor M2 are turned on;
Res_RF is the resistance of the first feedback resistor 76; and Res1, Res2, Res3, Res4 are the resistances of the resistor R1, the resistor R2, the resistor R3, and the resistor R4, respectively.

The slopes k1 of line segments 80 and 82 in FIG. 8 may be controlled by the first transistor M1 and the second transistor M2. When the source voltage Vsource is less than the threshold value Vt, the first transistor M1 may be turned off to electrically disconnect the first end from the second end of the first transistor M1 and the second transistor M2 may be turned off to electrically disconnect the first end from the second end of the second transistor M2, and consequently, a total resistance of the resistor R1 and the resistor R2 may be the equivalence resistance of the first resistance selection circuit 72 and a total resistance of the resistor R3 and the resistor R4 may be the equivalence resistance of the second resistance selection circuit 74, producing a shallow slope of the line segment 80 in FIG. 8. When the source voltage Vsource is greater than the threshold value Vt, the first transistor M1 may be turned on to electrically connect the first end and the second end of the first transistor M1 and the second transistor M2 may be turned on to electrically connect the first end and the second end of the second transistor M2, and consequently, the resistor R1 is bypassed and the resistance Res2 of the second resistor R2 may be the equivalence resistance of the first resistance selection circuit 72, the resistor R3 is bypassed and the resistance Res4 of the resistor R4 may be the equivalence resistance of the second resistance selection circuit 74, producing a steep slope of the line segment 82 in FIG. 8.

The first adjusting module 7 is not limited to generating a control voltage Vctr1 positively correlated to a source voltage Vsource, and can be configured to generate a control voltage Vctr1 negatively correlated to a source voltage Vsource by electrically connecting the first reference voltage terminal having the first reference voltage Vr3 to the first end of the first amplifier 70 via the first resistance selection circuit 72 and electrically connecting the voltage source having the source voltage Vsource to the second end of the first amplifier 70 via the second resistance selection circuit 74. Generally speaking, the first resistance selection circuit 72 may be electrically connected between the first input end of the first amplifier 70 and one of the voltage source and the first reference voltage terminal having the first reference voltage Vr3, and the second resistance selection circuit 74 may be electrically connected between the second input end of the first amplifier 70 and another one of the voltage source and the first reference voltage terminal. When the first resistance selection circuit 72 is electrically connected between the voltage source and the first input end of the first amplifier 70, and the second resistance selection circuit 74 is electrically connected between the first reference voltage terminal and the second input end of the first amplifier 70, the first amplifier 70 is configured to generate the control voltage Vctr1 positively correlated with the source voltage Vsource. When the first resistance selection circuit 72 is electrically connected between the first reference voltage terminal and the first input end of the first amplifier 70, and the second resistance selection circuit 74 is electrically connected between the voltage source and the second input end of the first amplifier 70, the first amplifier 70 is configured to generate the control voltage Vctr1 negatively correlated with the source voltage Vsource.

Figure 9:
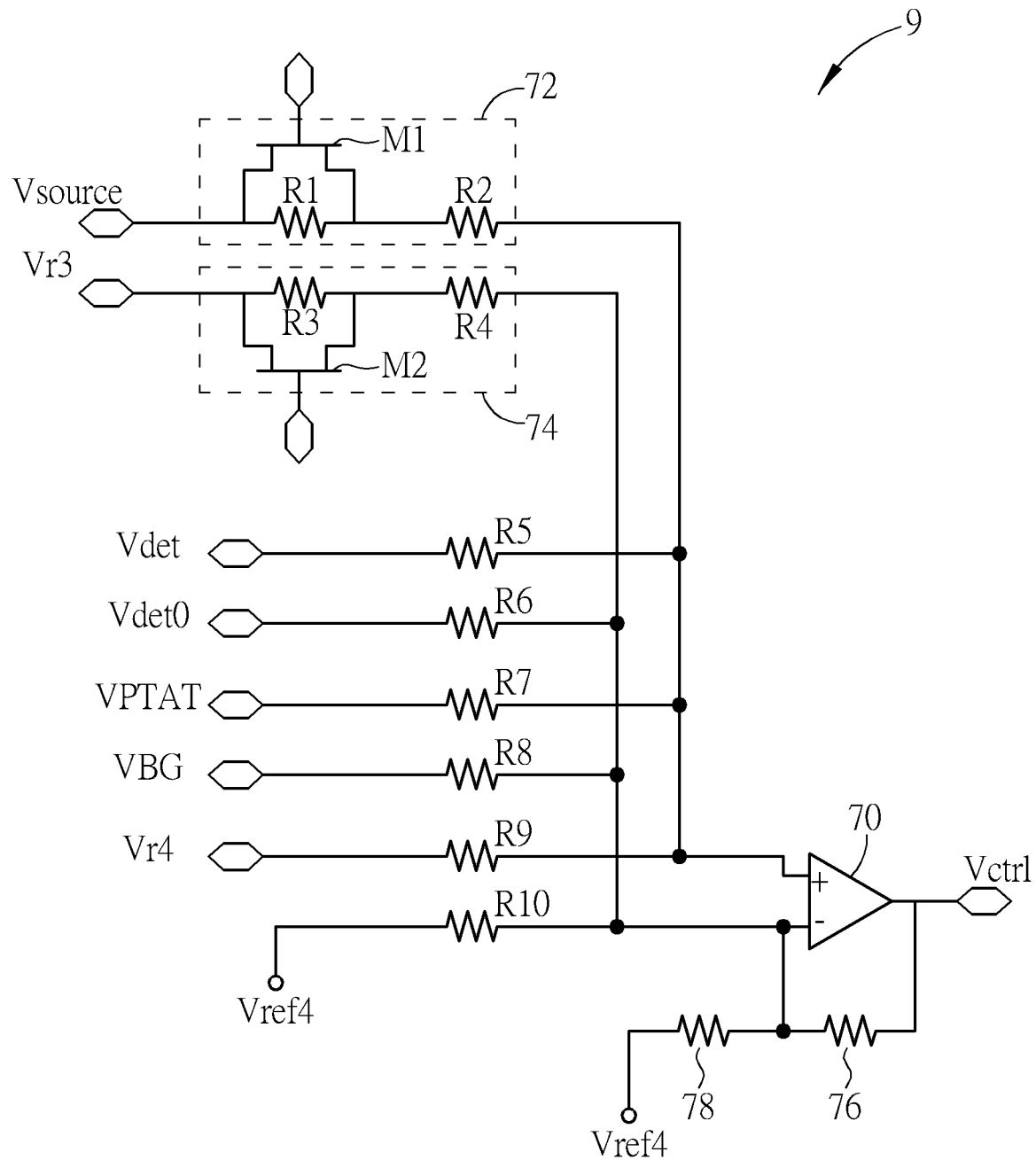
FIG. 9 is a schematic diagram of a first adjusting module according to another embodiment of the embodiment.

Furthermore, the first adjusting module 7 is not limited to compensation of variations in the source voltage Vsource, and can also be used to compensate for variations in temperature of the amplifier device 1 and power of the output signal. FIG. 9 depicts a schematic diagram of a first adjusting module 9 according to another embodiment of the embodiment. The first adjusting module 9 may compensate for variations in the source voltage Vsource, temperature of the amplifier device 1 and power of the output signal.

The first adjusting module 9 comprises the first amplifier 70, the first resistance selection circuit 72, the second resistance selection circuit 74, the first feedback resistor 76, the second feedback resistor 78, and resistors R5 through R10. The configuration and operations of the first amplifier 70, the first resistance selection circuit 72, the second resistance selection circuit 74, the first feedback resistor 76 and the second feedback resistor 78 are identical to those in FIG. 7, and explanations therefor have been provided in the preceding paragraphs and will be omitted here for brevity. The resistor R5 is electrically connected between the first input end of the first amplifier 70 and a power input terminal, the power input terminal being configured to receive a power-correlated signal correlating to the power Vdet of the output signal. The resistor R6 is electrically connected between the second input end of the first amplifier 70 and a second reference voltage terminal having a second reference voltage Vdet0. The second reference voltage Vdet0 may be a reference voltage that is independent of power variations of the output signal. The resistor R7 is electrically connected between the first input end of the first amplifier 70 and a temperature input terminal, the temperature input terminal being configured to receive a temperature-correlated signal VPTAT correlating to a temperature of the amplifier device 1. The temperature-correlated signal VPTAT is proportional to absolute temperature (PTAT) signal. The resistor R8 is electrically connected between the second input end of the first amplifier 70 and a third reference voltage terminal having a third reference voltage VBG. The third reference voltage VBG may be a bandgap reference voltage that is independent of temperature variations. The resistor R9 is electrically connected between the first input end of the first amplifier 70 and a fourth reference voltage terminal configured to receive a fourth reference voltage Vr4. The fourth reference voltage Vr4 may be a reference voltage that is independent of voltage source variations, temperature variations, and power variations of the output signal. That is, the bias module 12 could be further configured to adjust linearity of the amplifier device 1 according to the power of the output signal and/or the temperature of the amplifier device 1 by using the control voltage Vctrl with the resistors R5, R6 and/or the resistors R7, R8 correspondingly. The resistor R10 is electrically connected between the second input end of the first amplifier 70 and the first reference potential terminal having the first reference potential Vref4. The resistor R5 and the resistor R6 may have substantially identical resistance, the resistor R7 and the resistor R8 may have substantially identical resistance, and the resistor R9 and the resistor R10 may have substantially identical resistance. The control voltage Vctrl output from the first amplifier 70 can be expressed by Equation 4:

$$Vctrl = k1*(Vsource - Vr3) + k2(Vdet - Vdet0) + k3(VPTAT - VBG) + k4(Vr4 - 0) \quad \text{Equation 4}$$

where Vr3 is the first reference voltage;
Vsource is the source voltage;
   k1=Res_RF/(Res1+Res2)=Res_RF/(Res3+Res4) when the first transistor M1 and the second transistor M2 are turned off;
   k1=Res_RF/Res2=Res_RF/Res4 when the first transistor M1 and the second transistor M2 are turned on;
   k2=Res_RF/R5=Res_RF/R6;
   k3=Res_RF/R7=Res_RF/R8;
   k4=Res_RF/R9=Res_RF/R10;
Res_RF is the resistance of the first feedback resistor 76; and Res1 through Res10 are the resistances of the resistors R1 through R10, respectively.

Figure 10:
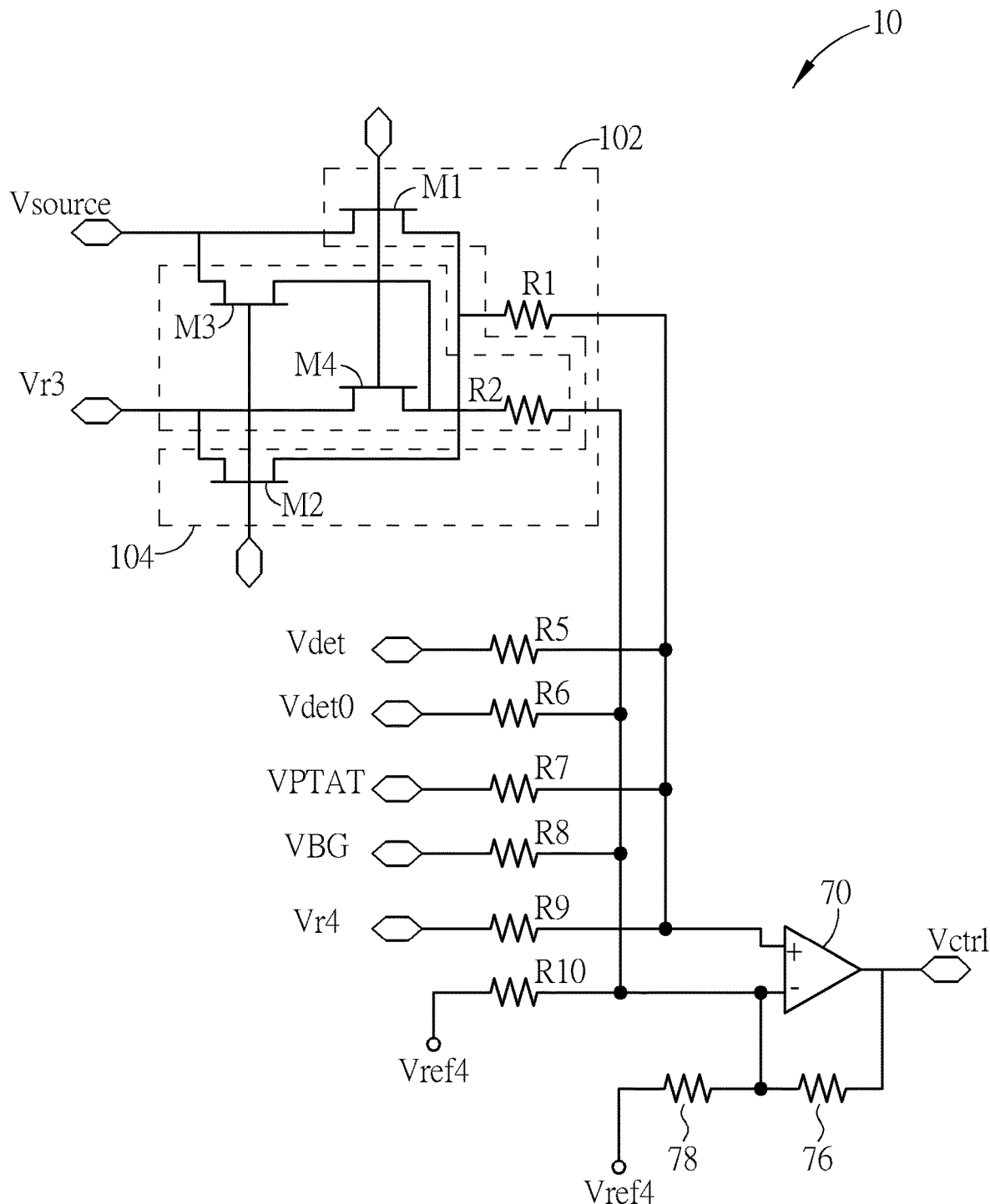
FIG. 10 is a schematic diagram of a first adjusting module according to yet another embodiment of the embodiment.
Figure 11:
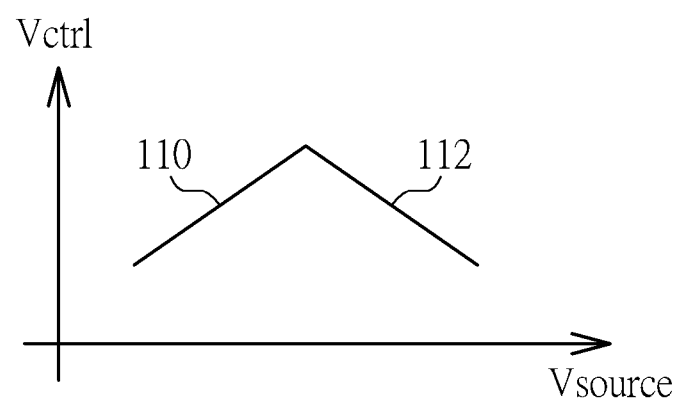
FIG. 11 depicts a positively correlated relationship and a negatively correlated relationship between the control voltage and the source voltage.

FIG. 10 is a schematic diagram of a first adjusting module 10 according to yet another embodiment of the embodiment. The first adjusting module 10 comprises the first amplifier 70, a first resistance selection circuit 102, the second resistance selection circuit 104, the first feedback resistor 76, the second feedback resistor 78, and resistors R5 through R10. The configuration and operations of the first amplifier 70, the first feedback resistor 76, the second feedback resistor 78 and the resistors R5 through R10 are identical to those in FIG. 9, and explanations therefor have been provided in the preceding paragraphs and will be omitted here for brevity. In some embodiments, it is desirable to compensate for variations of the source voltage Vsource using positively correlated control voltages Vctrl as well as negatively correlated control voltages Vctrl, as depicted by line segments 110 and 112 in FIG. 11. In such a case, the first adjusting module 10 may configure the first resistance selection circuit 102 and the second resistance selection circuit 104 as required to generate a control voltage Vctrl. More specifically, the first resistance selection circuit 102 may select one of the source voltage Vsource and the first reference voltage Vr3, and connect the corresponding terminal of the selected one to the first end of the first amplifier 70, and similarly, the second resistance selection circuit 104 may select another one of the source voltage Vsource and the first reference voltage Vr3, and connect the corresponding terminal of the selected another one to the second end of the first amplifier 70, thereby generating the control voltages Vctrl.

The first resistance selection circuit 102 comprises a first transistor M1, a second transistor M2 and a resistor R1. The first transistor M1 comprises a first end electrically connected to the voltage source having the source voltage Vsource, a second end and a control end. The second transistor M2 comprises a first end electrically connected to the first reference voltage terminal having the first reference voltage Vr3, a second end electrically connected to the second end of the first transistor M1, and a control end. The resistor R1 is electrically connected between the second end of the first transistor M1 and the first input end of the first amplifier 70. The second resistance selection circuit 104 comprises a third transistor M3, a fourth transistor M4 and a resistor R2. The third transistor M3 comprises a first end electrically connected to the voltage source having the source voltage Vsource, a second end, and a control end electrically connected to the control end of the second transistor M2. The fourth transistor M4 comprises a first end electrically connected to the first reference voltage terminal having the first reference voltage Vr3, a second end electrically connected to the second end of the third transistor M3, and a control end electrically connected to the control end of the first transistor M1. The second resistor R2 is electrically connected between the second end of the third transistor M3 and the second input end of the first amplifier 70. The transistors M1 though M4 may be BJT or FET, such as N-type or P-type metal-oxide semiconductor field-effect transistors (MOSFET). The transistors M1 and M4 are turned on or off simultaneously, and the transistors M2 and M3 are turned on or off simultaneously.

The transistors M1 and M2 operate in anti-phase, and the transistors M3 and M4 operate in anti-phase. When the first transistor M1 and the fourth transistor M4 are turned on, and the second transistor M2 and the third transistor M3 are turned off, the first amplifier 70 may generate the control voltage Vctrl positively correlated with the source voltage Vsource. When the first transistor M1 and the fourth transistor M4 are turned off, and the second transistor M2 and the third transistor M3 are turned on, the first amplifier 70 may generate the control voltage Vctrl negatively correlated with the source voltage Vsource. The control voltage Vctrl can be expressed by Equation 5:

$$Vctrl=k1*(Vsource-Vr3)+k2(Vdet-Vdet0)+k3(VPTAT-VBG)+k4(Vr4-0) \quad \text{Equation 5}$$

where Vr3 is the first reference voltage;
Vsource is the source voltage;
  k1=Res_RF/Res1 for the positively correlated control voltage Vctrl, and k1=−Res_RF/Res1 for the negatively correlated control voltage Vctrl
  k2=Res_RF/R5=Res_RF/R6;
  k3=Res_RF/R7=Res_RF/R8;
  k4=Res_RF/R9=Res_RF/R10;
Res_RF is the resistance of the first feedback resistor 76; and Res1 through Res10 are the resistance of the resistors R1 through R10, respectively.

The first adjusting modules 7, 9 and 10 may generate a control voltage Vctrl to compensate for variations in the source voltage Vsource of the amplifying unit 1, temperature of the amplifier device 1 and/or power of the output signal, thereby maintaining linearity of the amplifier device 1.

Figure 12:
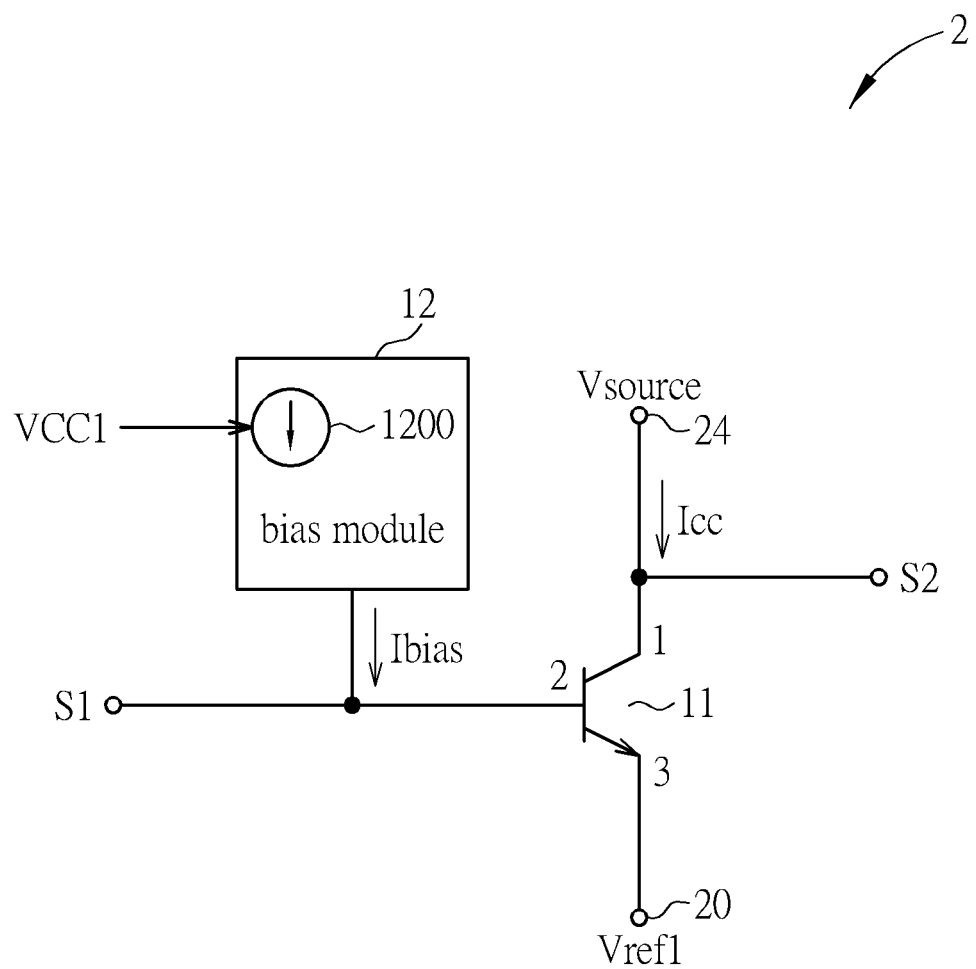
FIG. 12 is a schematic diagram of an amplifier device according to another embodiment of the present disclosure.
Figure 13:
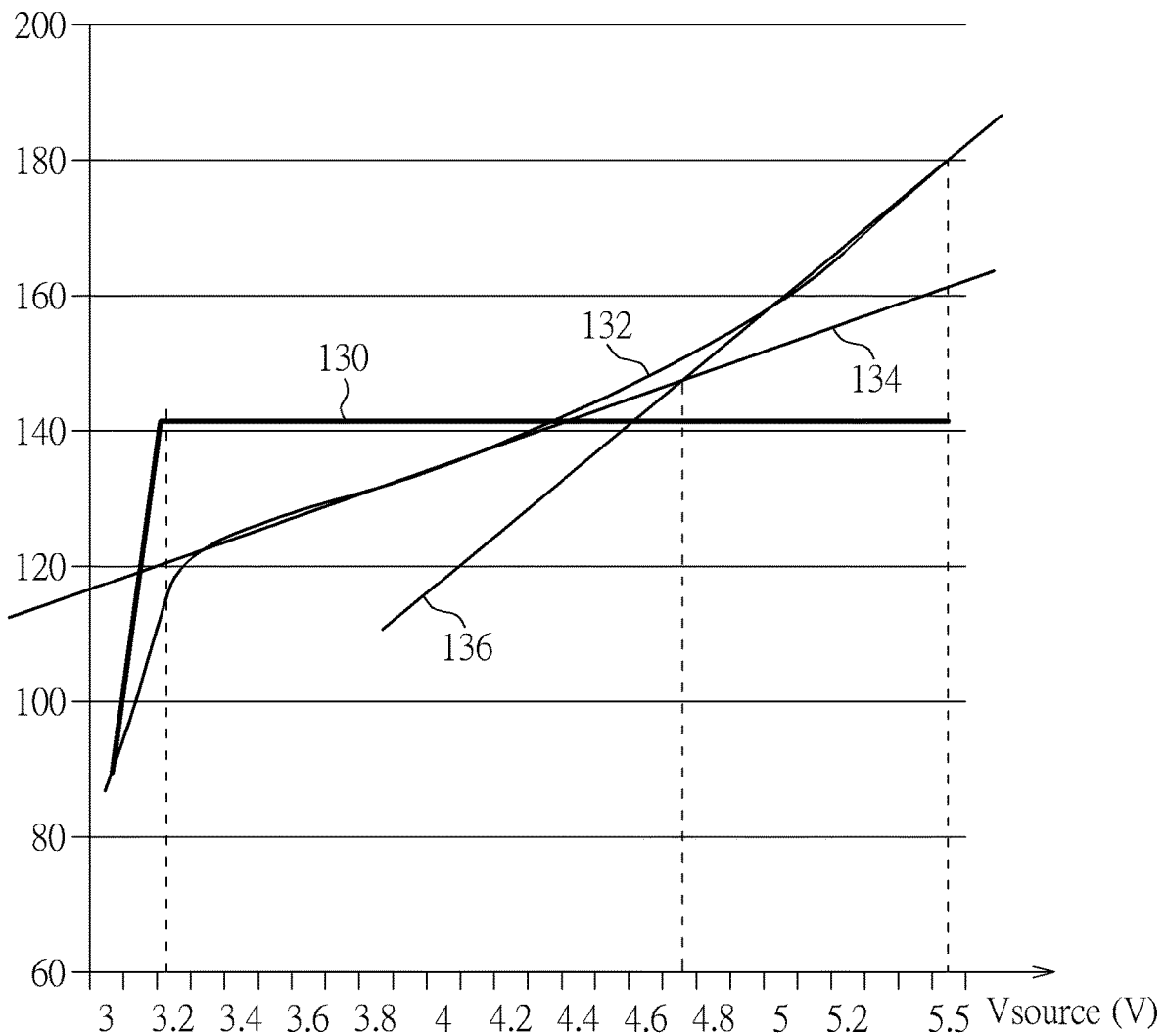
FIG. 13 shows a voltage response of a supply current without a compensation.

FIG. 12 is a schematic diagram of an amplifier device 2 according to another embodiment of the present disclosure. The amplifier device 2 comprises the amplifying unit 11 and the bias module 12. The amplifying unit 11 may draw a supply current Icc from the voltage source 24 receiving a source voltage Vsource. The source voltage Vsource is a time-varying voltage. As the source voltage Vsource varies with time, the supply current Icc varies accordingly. FIG. 13 shows a voltage response of a supply current Icc without a compensation, with the horizontal axis representing the source voltage Vsource in volts and the vertical axis representing the supply current Icc in milliamperes. A line 130 represents an ideal supply current Icc, a line 132 represents a real supply current Icc, and lines 134 and 136 represent first and second approximations of the real supply current Icc. In one embodiment, the source voltage Vsource may vary from 5.5V to 3.2V over time, and the amplifying unit 11 may operate over the range of the source voltage Vsource. Ideally, the supply current Icc should be maintained substantially at 140 mA, as indicated by the line 130. In practice, the supply current Icc may vary between 120 mA and 160 mA, as indicated by the line 132. For the source voltage Vsource ranging between 3.2V and 4.7V, the line 132 may be approximated by the line 134, and for the source voltage Vsource ranging between 4.7V and 5.5V, the line 132 may be approximated by the line 136. The lines 134 and 136 may have a first gradient and a second gradient, respectively.

Figure 14:
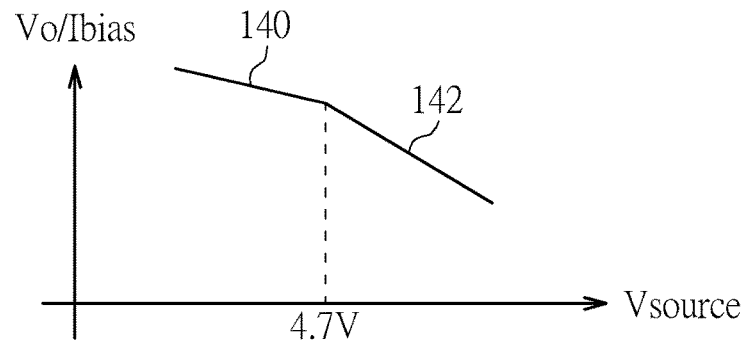
FIG. 14 depicts a voltage compensation scheme employing a bias current according to an embodiment of the invention.

FIG. 14 depicts a voltage compensation scheme employing a bias current Ibias according to an embodiment of the invention. Line segments 140 and 142 represent the bias current Ibias generated by the bias module 12 for the source voltage Vsource less than and exceeding a threshold value, respectively. The threshold value may be selected substantially at the voltage where the lines 134 and 136 in FIG. 13 intersect with each other, e.g., 4.7V. The line segments 140 and 142 show that the bias current Ibias are negatively correlated to the source voltage Vsource in FIG. 13. Further, the line segment 140 has a first counter-gradient corresponding to the first gradient of the line 134 in FIG. 13, and the line segment 142 has a second counter-gradient corresponding to the second gradient of the line 136 in FIG. 13. The first counter-gradient may be negatively correlated to the first gradient, and the second counter-gradient may be negatively correlated to the second gradient. The amplifier device 2 may compensate for variations of the source voltage Vsource over time by adjusting the bias current Ibias according to the line segments 140 and 142, thereby maintaining the amplifying unit 11 to operate substantially at a constant supply current, e.g., 140 mA, and enhancing the performance of the amplifier device 2. In some embodiments, for the source voltage Vsource less than 4.7V, the bias module 12 may adjust the bias current Ibias according to the line segment 140, and for the source voltage Vsource exceeding 4.7V, the bias module 12 may adjust the bias current Ibias according to the line segment 142. In some embodiments, the amplifier device 2 may compensate for the variations of the source voltage Vsource according to the line segment 140 or the line segment 142.

Although only two lines 134 and 136 are used to approximate the real supply current Icc (line 132) in FIG. 13, those in the art would appreciate that more than two approximation lines may be used to approximate the real supply current Icc, and accordingly, more than two corresponding lines negatively correlated to the more than two approximation lines may be used to simulate the bias current Ibias over the desired operating range, and two or more threshold values may be used to determine which of the more than two corresponding lines may be used to simulate the bias current Ibias to compensate for variations of the source voltage Vsource. The counter-gradients of lines simulating the bias current Ibias and the threshold value(s) are not limited to the example provided in FIG. 14, and may be selected based on actual applications and design requirements.

Referring to FIG. 12, the amplifying unit 11 has a first end coupled to the voltage source 24 configured to receive the source voltage Vsource, and the supply current ICC flowing into the first end of the amplifying unit 11, a second end configured to receive an input signal S1, and a third end coupled to a first reference potential terminal 20. The amplifying unit 11 may be a BJT, and may serve as a power amplifier or a low noise amplifier. The amplifying unit 11 may be biased by the bias current Ibias to amplify the input signal S1, so as to output an output signal S2 amplified by the amplifying unit 11 at the first end of the amplifying unit 11. The first reference potential terminal 20 may receive a first reference potential Vref1. The first reference potential Vref1 may be a ground reference potential or other reference potentials.

The bias module 12 may be coupled to the second end of the amplifying unit 11, and may receive a voltage signal VCC1 to provide the bias current Ibias to the amplifying unit 11. The voltage signal VCC1 may be substantially positively correlated to the time-varying source voltage Vsource, and therefore, the voltage signal VCC1 may also be a time-varying variable voltage. In some embodiments, the voltage signal VCC1 may be a fraction of the source voltage Vsource, and may be derived from the source voltage Vsource using a voltage divider, where VCC1=Vsource*K, and K may be 0.5. In other embodiments, the voltage signal VCC1 may be substantially identical to the source voltage Vsource.

Since the voltage signal VCC1 is substantially positively correlated to the source voltage Vsource, and the bias current Ibias represented by the line segments 140 and 142 in FIG. 14 is negatively correlated to the voltage signal VCC1, the bias module 12 may adjust the bias current Ibias according to the voltage signal VCC1. A decrease of the source voltage Vsource will result in an increase of the bias current Ibias, and consequently, an increase of the supply current Icc. Conversely, an increase of the source voltage Vsource will result in a decrease of the bias current Ibias, and consequently, a decrease of the supply current Icc. In this manner, variations of the supply current Icc owing to the variations of the source voltage Vsource may be compensated, and the supply current Icc may be adjusted in accordance with the voltage signal VCC1 to stay within a predetermined range, e.g., within ±3% of 140 mA.

Figure 15:
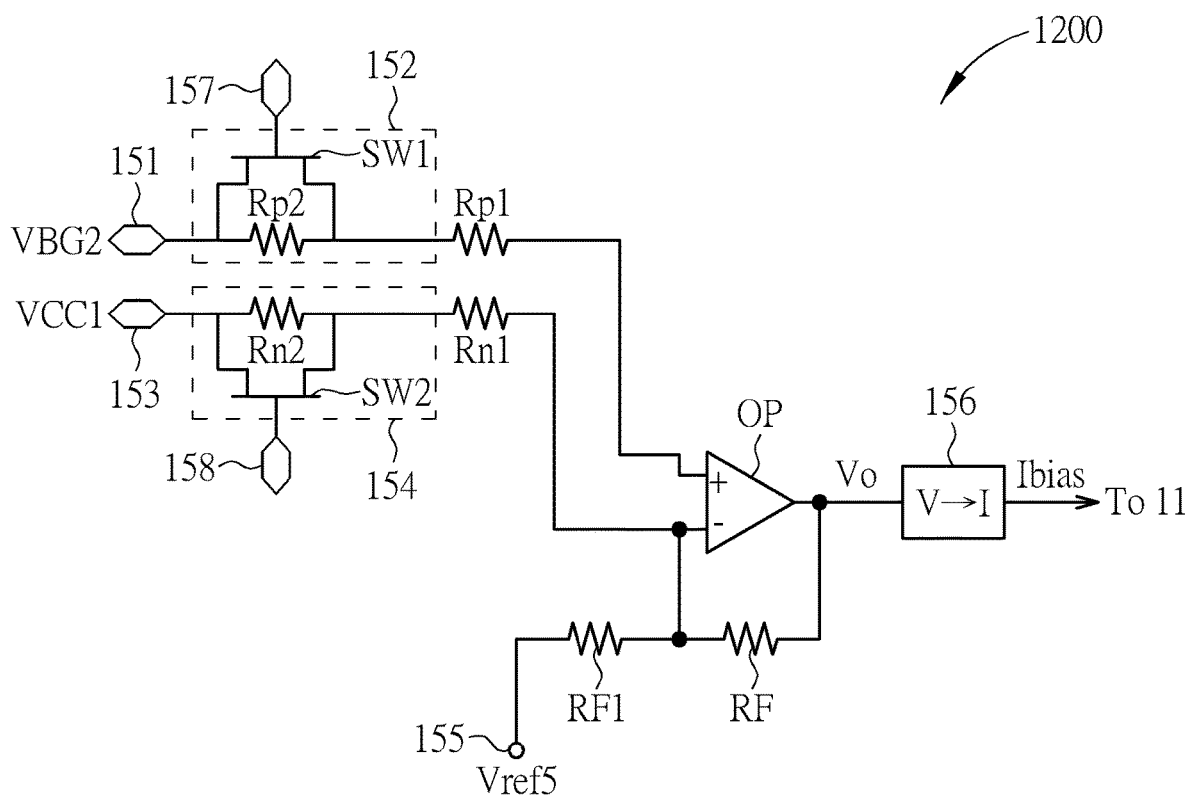
FIG. 15 is a schematic diagram of the variable current source in FIG. 12 according to an embodiment of the invention.

The bias module 12 may comprise a variable current source 1200. In some embodiments, the variable current source 1200 may be a variable resistor configured to adjust the bias current Ibias according to the voltage signal VCC1. In other embodiments, as illustrated in FIG. 15, the variable current source 1200 may comprise signal terminals 151, 153, a reference potential terminal 155, an operational amplifier OP, a first resistance selection circuit 152, a second resistance selection circuit 154, resistors Rp1, Rn1, RF, RF1, a voltage-to-current converter 156 and switch control terminals 157, 158. In some embodiments, the resistance of the resistor Rn1 may be adjusted to selectively remove the resistor RF1 from the variable current source 1200. The variable current source 1200 may receive the voltage signal VCC1 and a reference signal VBG2 to generate the bias current Ibias according to the line segments 140 and 142 in FIG. 14. The reference signal VBG2 may be a bandgap reference voltage or any other reference voltage that is substantially fixed with respect to the source voltage Vsource variations.

The operational amplifier OP may have a first input end, a second input end and an output end, with the first input end being a non-inverting end, the second input end being an inverting end, and the output end outputting an output voltage Vo. The first input end of the operational amplifier OP may be coupled to the signal terminal 151 and receive the reference signal VBG2, and the second input end of the operational amplifier OP may be coupled to the signal terminal 153 and receive the voltage signal VCC1. The output end of the operational amplifier OP may output the output voltage Vo according to a difference between the reference signal VBG2 and the voltage signal VCC1. In other embodiments, the operational amplifier OP may be an adder.

The voltage-to-current convertor 156 may comprise a first end coupled to the output end of the operational amplifier OP, and a second end coupled to the second end of the amplifying unit 11. The voltage-to-current convertor 156 may convert the output voltage Vo into the bias current Ibias, and may be a MOSFET, a BJT, or other types of transistors.

The resistor RF may comprise a first end coupled to the second input end of the operational amplifier OP, and a second end coupled to the output end of the operational amplifier OP. The resistor RF1 may comprise a first end coupled to the first end of the resistor RF, and a second end coupled to the reference potential terminal 155 receiving a reference potential Vref5. The reference potential Vref5 may be a ground reference potential or other reference potentials. In some embodiments, the reference potential Vref5 and the first reference potential Vref1 may have substantially identical reference potentials. In some embodiments, the resistors RF, RF1 may have substantially identical resistance. In some embodiments, the resistors RF, RF1 may be variable. In some embodiments, the resistance of the resistor RF1 may be set as a multiple of the resistance of the resistor RF to modify the gradients of the line segments 140 and 142 in FIG. 14.

The resistor Rp1 may comprise a first end coupled to the signal terminal 151 via the first resistance selection circuit 152, and a second end coupled to the first input end of the operational amplifier OP. The resistor Rn1 may comprise a first end coupled to the signal terminal 153 via the second resistance selection circuit 154, and a second end coupled to the second input end of the operational amplifier OP. The resistors Rp1, Rn1 may be variable. The first resistance selection circuit 152 may comprise a first end coupled to the signal terminal 151, and a second end coupled to the first end of the resistor Rp1. The second resistance selection circuit 154 may comprise a first end coupled to the signal terminal 153, and a second end coupled to the first end of the resistor Rn1. The first resistance selection circuit 152 may comprise a switch SW1 and a resistor Rp2. The switch SW1 may comprise a first end coupled to the first end of the first resistance selection circuit 152, a second end coupled to the second end of the first resistance selection circuit 152, and a control end coupled to the switch control terminal 157. The switch control terminal 157 may receive a first control signal to turn on or turn off the switch SW1. The resistor Rp2 may be coupled between the first end of the switch SW1 and the second end of the switch SW1. The second resistor selection circuit 154 may comprise a switch SW2 and a resistor Rn2. The switch SW2 may comprise a first end coupled to the first end of the second resistor selection circuit 154, a second end coupled to the second end of the second resistor selection circuit 154, and a control end coupled to the switch control terminal 158. The switch control terminal 158 may receive a second control signal to turn on or turn off the switch SW2. The resistor Rn2 may be coupled between the first end of the switch SW2 and the second end of the switch SW2. The switches SW1 and SW2 may be MOSFET, BJT, or other types of transistors. The resistors Rp2, Rn2 may be variable. The resistors Rp1, Rn1 may have substantially identical resistance, and the resistors Rp2, Rn2 may have substantially identical resistance. In some embodiments, the resistor Rp1 and the first resistance selection circuit 152 may be swapped in place, that is, the first end of the resistor Rp1 may be coupled to the signal terminal 151, the second end of the resistor Rp1 may be coupled to the first end of the first resistance selection circuit 152, and the second end of the first resistance selection circuit 152 may be coupled to the first input end of the operational amplifier OP. Similarly, the resistor Rn1 and the second resistance selection circuit 154 may be swapped in place, that is, the first end of the resistor Rn1 may be coupled to the signal terminal 153, the second end of the resistor Rn1 may be coupled to the first end of the second resistance selection circuit 154, and the second end of the second resistance selection circuit 154 may be coupled to the second input end of the operational amplifier OP.

The first resistance selection circuit 152 and the second resistor selection circuit 154 may be used to adjust a rate of change of the output voltage Vo and/or the bias current Ibias with respect to the difference of the reference signal VBG2 and the voltage signal VCC1. Specifically, the switches SW1 and SW2 are turned on or off together to switch between the rates of change of the output voltage Vo and/or the bias current Ibias. The output voltage Vo can be expressed by Equation 6:

$$Vo = k1*(VBG2-VCC1) \qquad \text{Equation 6}$$

where VBG2 is the reference signal independent of source voltage variations;

VCC1 is the voltage signal;

k1=Res_RF/(Res_Rp1+Res_Rp2)=Res_RF/(Res_Rn1+Res_Rn2) when the switch SW1 and the switch SW2 are turned off;

k1=Res_RF/Res_Rp1=Res_RF/Res_Rn1 when the switch SW1 and the switch SW2 are turned on; and Res_RF, Res_Rp1, Res_Rn1, Res_Rp2, Res_Rn2 are the resistances of the resistors RF, Rp1, Rn1, Rp2, Rn2, respectively.

The output voltage Vo may be determined by a difference (VBG2−VCC1) and a gradient k1. Since the reference signal VBG2 is independent of source voltage variations and the voltage signal VCC1 is positively correlated to the source voltage Vsource, an increase of the source voltage Vsource will lead to a decrease of the difference (VBG2−VCC1), and subsequently, a decrease of the output voltage Vo; and a decrease of the source voltage Vsource will lead to an increase of the difference (VBG2−VCC1), and subsequently, an increase of the output voltage Vo. In this manner, the variations of the source voltage Vsource may be compensated to provide a substantially constant supply current Icc to the amplifying unit 11.

Referring to FIG. 14, the first counter-gradient of the line segment 140 and the second counter-gradient of the line segment 142 may be realized by the variable current source 1200 using the first resistance selection circuit 152 and the second resistor selection circuit 154. When the source voltage Vsource is less than the threshold value, the switch SW1 may be turned off to electrically disconnect the first end from the second end of the switch SW1, and the switch SW2 may be turned off to electrically disconnect the first end from the second end of the switch SW2, and consequently, a total resistance (Res_Rp1+Res_Rp2) of the resistor Rp1 and the resistor Rp2 and a total resistance (Res_Rn1+Res_Rn2) of the resistor Rn1 and the resistor Rn2 may be used to produce a gentler gradient k1, e.g., the first counter-gradient of the line segment 140. When the source voltage Vsource exceeds the threshold value, the switch SW1 may be turned on to electrically connect the first end and the second end of the switch SW1, and the switch SW2 may be turned on to electrically connect the first end and the second end of the switch SW2, and consequently, the resistance Res_Rp1 of the resistor Rp1 and the resistance Res_Rn1 of the resistor Rn1 may be used to produce a steeper gradient k1, e.g., the second counter-gradient of the line segment 142. In some embodiments, one line having a single counter-gradient is used to simulate the bias current Ibias, the first resistance selection circuit 152 and the second resistor selection circuit 154 may be omitted from the variable current source 1200. In some embodiments, the first resistance selection circuit 152, the second resistor selection circuit 154, and the resistors Rp1, Rn1 may be removed from the variable current source 1200 and included in an external circuit other than the variable current source 1200.

The variable current source 1200 is not limited to providing a bias current Ibias negatively correlated to the source voltage Vsource, and can be configured to provide a bias current Ibias positively correlated to the source voltage Vsource by swapping places of the first resistance selection circuit 152 and the resistor Rp1 with the second resistance selection circuit 154 and the resistor Rn1. That is, sequentially connecting the first resistance selection circuit 152 and the resistor Rp1 between the signal terminal 153 and the second input end of the operational amplifier OP, and sequentially connecting the second resistance selection circuit 154 and the resistor Rn1 between the signal terminal 151 and the first input end of the operational amplifier OP. In such a configuration, the variable current source 1200 may generate the bias current Ibias positively correlated with the source voltage Vsource.

Figure 16:
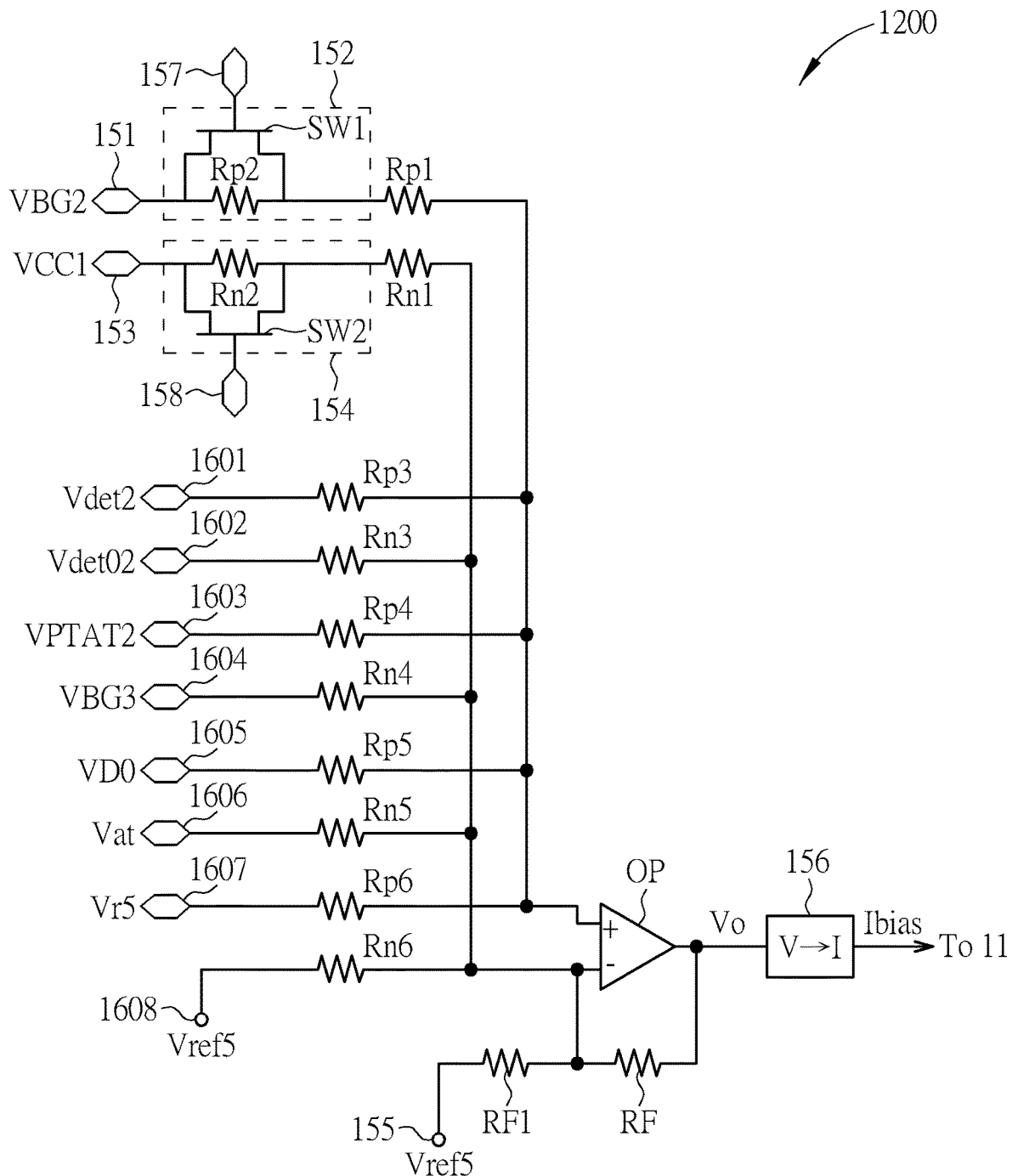
FIG. 16 is a schematic diagram of the variable current source in FIG. 12 according to another embodiment of the invention.

Furthermore, the variable current source 1200 is not limited to compensation for source voltage variations, and can also be used to compensate for temperature variations and signal power variations, as illustrated in FIG. 16, in which a schematic diagram of a variable current source 1200 according to another embodiment is provided. The variable current source 1200 comprises the signal terminals 151, 153, the reference potential terminal 155, the operational amplifier OP, the first resistance selection circuit 152, the second resistance selection circuit 154, the resistors Rp1, Rn1, RF, RF1, the voltage-to-current converter 156, the switch control terminals 157, 158, resistors Rp3 to Rp6, Rn3 to Rn6, signal terminals 1601 to 1607 and a reference potential terminal 1608. The variable current source 1200 may generate the bias current Ibias to compensate for source voltage variations, power variations of the input signal or the output signal, ambient temperature variations, and/or temperature variations of the amplifying unit. The configuration and operations of the operational amplifier OP, the first resistance selection circuit 152, the second resistance selection circuit 154, the resistors Rp1, Rn1, RF, RF1 are identical to those in FIG. 15, and explanations therefor have been provided in the preceding paragraphs and will be omitted here for brevity. In some embodiments, the resistance of the resistors Rn1, Rn3, Rn4, Rn5, Rn6 or a combination thereof may be adjusted to selectively remove the resistor RF1 from the variable current source 1200.

The resistor Rp3 may comprise a first end coupled to the signal terminal 1601 to receive a power signal Vdet2, and a second end coupled to the first input end of the operational amplifier OP. The resistor Rn3 may comprise a first end coupled to the signal terminal 1602 to receive a reference signal Vdet02, and a second end coupled to the second input end of the operational amplifier OP. The power signal Vdet2 may represent power of the input signal S1 or the output signal S2. The reference signal Vdet02 may be a reference voltage that is substantially fixed with respect to power variations of the input signal S1 or the output signal S2.

The resistor Rp4 may comprise a first end coupled to the signal terminal 1603 to receive a temperature signal VPTAT2, and a second end coupled to the first input end of the operational amplifier OP. The resistor Rn4 may comprise a first end coupled to the signal terminal 1604 to receive a reference signal VBG3, and a second end coupled to the second input end of the operational amplifier OP. The temperature signal VPTAT2 may be a proportional to absolute temperature (PTAT) signal. In some embodiments, a complementary to absolute temperature (CTAT) signal may also be employed for the temperature compensation. In the case of using the CTAT signal, the first end of the resistor Rp4 may be configured to receive the reference signal VBG3 via the signal terminal 1603, and the first end of the resistor Rn4 may be configured to receive the CTAT signal via the signal terminal 1604. The reference signal VBG3 may be a bandgap reference voltage that is substantially fixed with respect to temperature variations, and may be substantially identical to the reference signal VBG2. In some embodiments, the temperature signal VPTAT2 and the reference signal VBG3 may be generated from circuits on the same die of an integrated circuit (IC).

The resistor Rp5 may comprise a first end coupled to the signal terminal 1605 to receive a temperature signal VD0, and a second end coupled to the first input end of the operational amplifier OP. The resistor Rn5 may comprise a first end coupled to the signal terminal 1606 to receive a temperature signal Vat, and a second end coupled to the second input end of the operational amplifier OP. The temperature signal VD0 may present a temperature on an IC that contains the amplifying unit 11, indicating an ambient temperature. The temperature signal Vat may represent a temperature at a location close to the amplifying unit 11, indicating a temperature of the amplifying unit 11. In some embodiments, the temperature signal Vat and the temperature signal VD0 may be generated from temperature detection circuits on the same die of an IC. In another embodiments, the temperature signal Vat and the temperature signal VD0 may be generated by separate temperature detection circuits on different dies of an IC. Specifically, the temperature detection circuit for generating the temperature signal Vat and the amplifying unit 11 may be arranged on a die, and the temperature detection circuit for generating the temperature signal VD0 may be arranged on another die and away from the amplifying unit 11.

The resistor Rp6 may comprise a first end coupled to the signal terminal 1607 to receive a reference signal Vr5, and a second end coupled to the first input end of the operational amplifier OP. The resistor Rn6 may comprise a first end coupled to the reference potential terminal 1608 to receive the reference potential Vref5, and a second end coupled to the second input end of the operational amplifier OP. The reference signal Vr5 may be a reference voltage that is substantially fixed with respect to source voltage variations.

The resistors Rp3 to Rp6, Rn3 to Rn6 may be variable. The resistors Rp3 and Rn3 may have substantially identical resistance, the resistors Rp4 and Rn4 may have substantially identical resistance, the resistors Rp5 and Rn5 may have substantially identical resistance, and the resistors Rp6 and Rn6 may have substantially identical resistance. The output voltage Vo can be expressed by Equation 7:

$$Vo = k1*(VBG2-VCC1) + k2(Vdet2-Vdet02) + k3(VPTAT2-VBG3) + k4(Vr5-Vref5) + k5(VD0-Vat) \quad \text{Equation 7}$$

where VBG2 is the reference signal independent of source voltage variations;
VCC1 is the voltage signal;
Vdet2 is the power signal;
Vdet02 is the reference signal independent of power variations of the input signal or the output signal;
VPTAT2 is the temperature signal;
VBG3 is the reference signal independent of temperature variations;
Vr5 is the reference signal independent of source voltage variations;
Vref5 is the reference potential;
VD0 is the temperature signal;
Vat is the temperature signal;
  k1=Res_RF/(Res_Rp1+Res_Rp2)=Res_RF/(Res_Rn1+Res_Rn2) when the switch SW1 and the switch SW2 are turned off;
  k1=Res_RF/Res_Rp1=Res_RF/Res_Rn1 when the switch SW1 and the switch SW2 are turned on;
  k2=Res_RF/Res_Rp3=Res_RF/Res_Rn3;
  k3=Res_RF/Res_Rp4=Res_RF/Res_Rn4;
  k4=Res_RF/Res_Rp6=Res_RF/Res_Rn6;
  k5=Res_RF/Res_Rp5=Res_RF/Res_Rn5; and
Res_RF, Res_Rp1 to Res_Rp6, Res_Rn1 to Res_Rn6 are the resistances of the resistors RF, Rp1 to Rp6, Rn1 to Rn6, respectively.

The output voltage Vo may be determined by the difference (VBG2−VCC1) and the gradient k1, a difference (Vdet2−Vdet02) and a gradient k2, a difference (VPTAT2−VBG3) and a gradient k3, a difference (Vr5−Vref5) and a gradient k4, and a difference (VD0−Vat) and a gradient k5. The difference (VBG2−VCC1) and the gradient k1 have been explained in the preceding paragraph, and explanation therefore will be omitted here.

The linearity of the amplifying unit 11 may vary with the power of the input signal S1 or the output signal S2 measured by the power signal Vdet2. The difference (Vdet2−Vdet02) may represent quantities of power variations and may be used to compensate for the power variations. The output end of the operational amplifier OP may further output the output voltage Vo according to the power signal Vdet2 and the reference signal Vdet02. Consequently, the bias module 12 may adjust the bias current Ibias in accordance with the power of the input signal S1 or the power of the output signal S2. In some embodiments, the bias current Ibias may be increased as the power of the input signal S1 or the output signal S2 increases, and decreased as the power of the input signal S1 or the output signal S2 decreases, thereby maintaining the linearity of the amplifying unit 11 and enhancing the efficiency of the amplifying unit 11.

The gain of the amplifying unit 11 may vary with the ambient temperature measured by the temperature signal VPTAT2. Specifically, the gain of the amplifying unit 11 may be decreased with an increase of the ambient temperature, and increased with a decrease of the ambient temperature. The difference (VPTAT2−VBG3) may represent quantities of ambient temperature variations and may be used to compensate for the ambient temperature variations. The output end of the operational amplifier OP may further output the output voltage Vo according to the temperature signal VPTAT2 and the reference signal VBG3. Consequently, the bias module 12 may adjust the bias current Ibias and control the gain of the amplifying unit 11 to stay within a predetermined gain range, e.g., ±2 dB of a specific gain of the amplifying unit 11. For example, the gain of the amplifying unit 11 may be adjusted to 28 dB at a high temperature, and to 32 dB at a low temperature, maintaining the gain of the amplifying unit 11 within 30 dB±2 dB over the range of temperature variations.

The gain of the amplifying unit 11 may vary with the temperature of the amplifying unit 11 measured by the temperature signal Vat. For example, the temperature of the amplifying unit 11 may increase with the operating time, resulting in a decrease of the gain. The difference (VD0−Vat) may represent quantities of variations between ambient temperatures and amplifying unit temperatures and may be used to compensate for the amplifying unit temperature variations. The output end of the operational amplifier OP may further output the output voltage Vo according to the temperature signal VD0 and the temperature signal Vat. Consequently, the bias module 12 may adjust the bias current Ibias and control the gain of the amplifying unit 11 to stay within a predetermined gain range, e.g., ±0.2 dB of a specific gain of the amplifying unit 11. For example, after the amplifying unit 11 operates for a while, the amplifying unit temperature may gradually rise, the gain of the amplifying unit 11 may be adjusted to 29.8 dB or 30.2 dB, maintaining gain of the amplifying unit 11 within 30 dB±0.2 dB.

The difference (Vr5−Vref5) may represent a base quantity for generating the bias current Ibias, i.e., a base value of the bias current Ibias to properly bias the amplifying unit 11 at an operating point. The output end of the operational amplifier OP may further output the output voltage Vo according to the reference signal Vr5 and the reference potential Vref5. Consequently, the bias module 12 may adjust the bias current Ibias. In some embodiments, the signal terminals 1607, the reference potential terminal 1608 and the resistors Rp6 and Rn6 may be removed from the variable current source 1200. The base value of the bias current Ibias may be provided by another bias current generation circuit.

Although only one possible gradient value is implemented for each of the gradients k2, k3, k4, k5 in FIG. 16, two or more gradients values may be achieved for each of the gradients k2, k3, k4, k5 by adopting a circuit configuration similar to the first resistance selection circuit 152 and the second resistance selection circuit 154 of the FIG. 15.

The variable current source 1200 in FIGS. 15 and 16 may generate a bias current Ibias to compensate for the source voltage variations, the input/output signal power variations, the ambient temperature variations, and/or the amplifying unit temperature variations, thereby enhancing the performance of the amplifier device 2.

Further, in some embodiments, rather than adopting the exact circuit configuration of the variable current source 1200 in FIG. 16, the circuit configuration in FIG. 16 may be adapted based on actual applications and design requirements to compensate for one or a selected combination of the input/output signal power variations, the ambient temperature variations and the amplifying unit temperature variations on top of the source voltage variations. In some embodiments, the first resistance selection circuit 152, the second resistor selection circuit 154, and the resistors Rp1, Rp3 to Rp6, Rn1, Rn3 to Rn6 may be removed from the variable current source 1200 and included in an external circuit other than the variable current source 1200.

Figure 17:
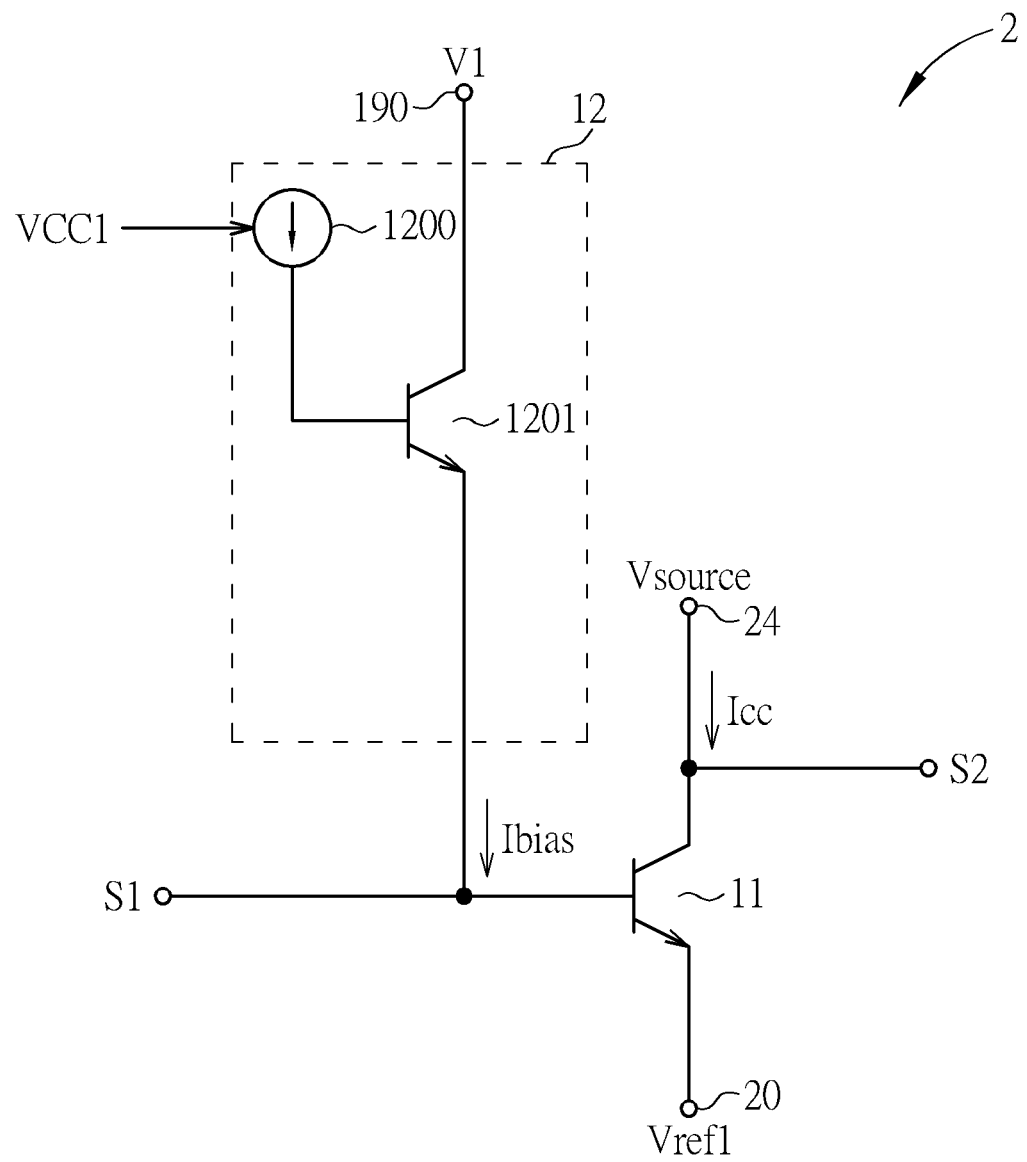
FIG. 17 is a schematic diagram of an amplifier device according to another embodiment of the invention.

FIG. 17 is a schematic diagram of the amplifier device 2 according to another embodiment of the invention. The bias module 12 may comprise the variable current source 1200 and a transistor 1201. The transistor 1201 may comprise a first end coupled to a bias voltage source 190, a second end coupled to the variable current source 1200, and a third end coupled to the second end of the amplifying unit 11. The bias voltage source 190 may receive a supply voltage V1. The variable current source 1200 may be implemented by the embodiments in FIGS. 15 and 16. In some embodiments, the transistor 1201 may be a MOSFET, a BJT, or other types of transistors.

Figure 18:
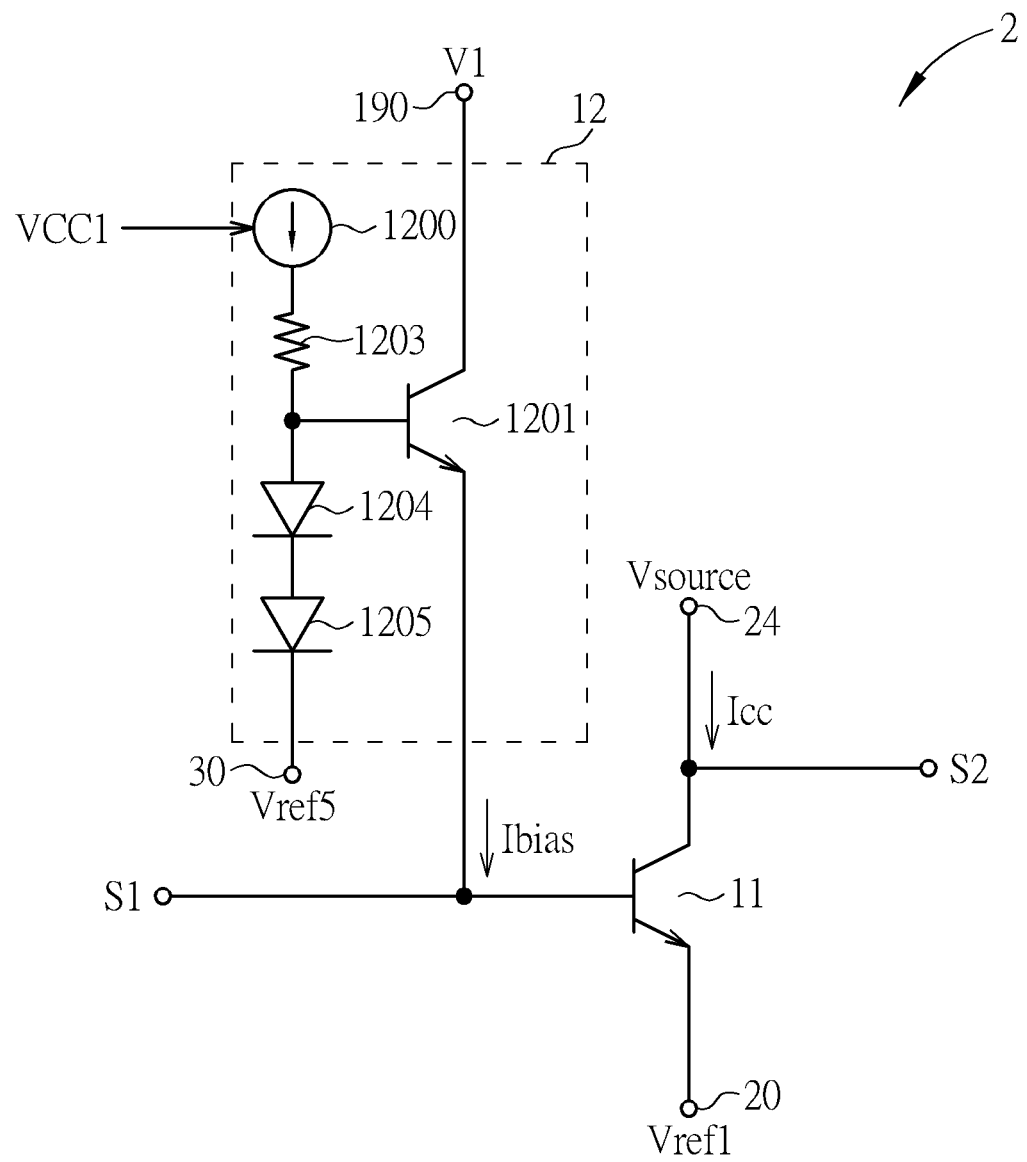
FIG. 18 is a schematic diagram of an amplifier device according to another embodiment of the invention.

FIG. 18 is a schematic diagram of the amplifier device 2 according to another embodiment of the invention. The bias module 12 may comprise the transistor 1201, the variable current source 1200, a resistor 1203 and diodes 1204, 1205. The configurations of the transistor 1201 and the variable current source 1200 are identical to those in FIG. 17, and explanation therefore will be omitted for brevity. The resistor 1203 may comprise a first end coupled to the variable current source 1200, and a second end coupled to the second end of the transistor 1201. The diode 1204 may comprise a first end coupled to the second end of the resistor 1203, and a second end. The diode 1205 may comprise a first end coupled to the second end of the diode 1204, and the second end coupled to a reference potential terminal 30. The reference potential terminal 30 may receive the reference potential Vref5. In some embodiments, the diodes 1204, 1205 may be diode connected transistors.

Figure 19:
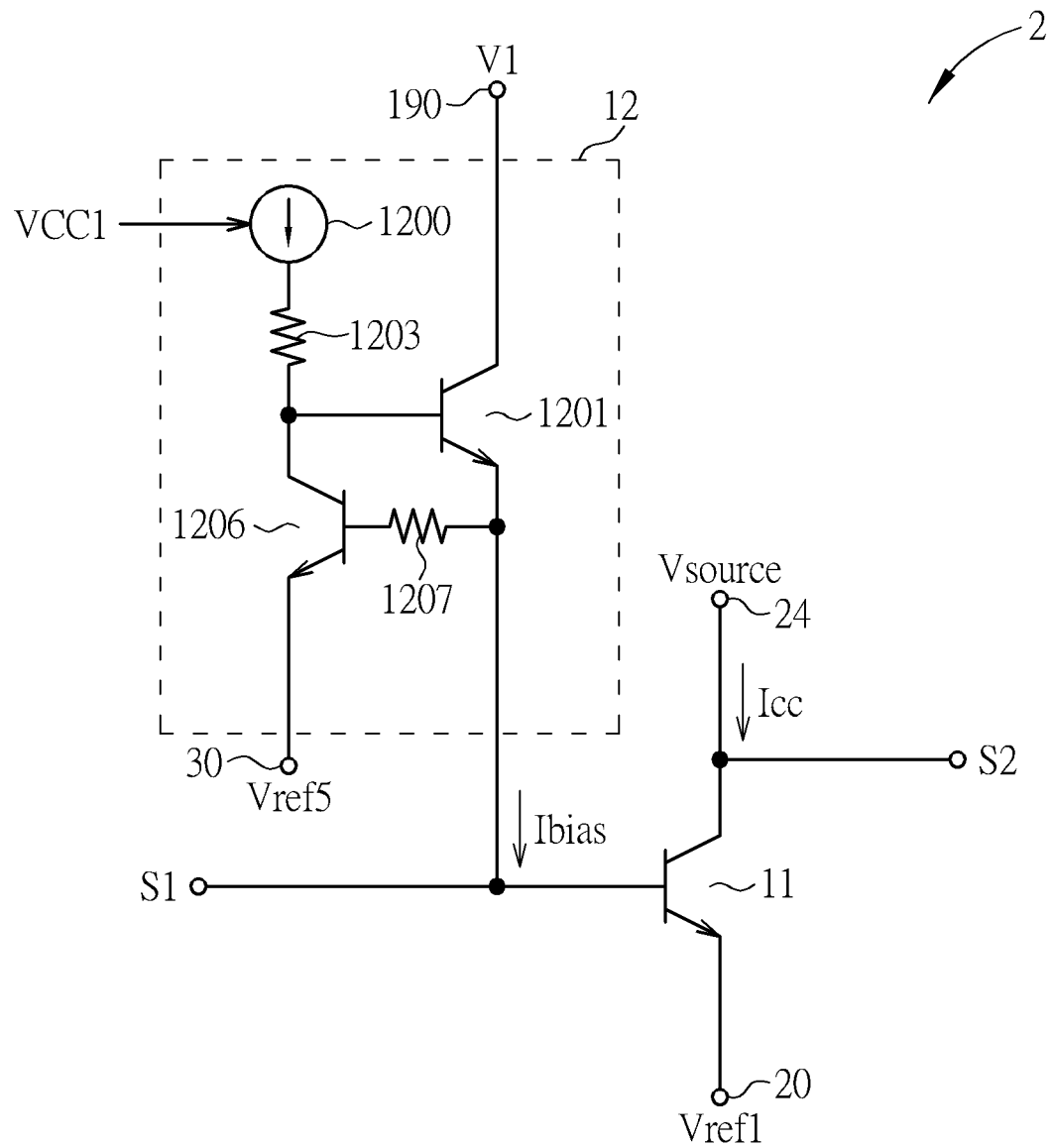
FIG. 19 is a schematic diagram of an amplifier device according to another embodiment of the invention.

FIG. 19 is a schematic diagram of the amplifier device 2 according to another embodiment of the invention. The bias module 12 may comprise the transistor 1201, the variable current source 1200, the resistor 1203, a transistor 1206 and a resistor 1207. The configurations of the transistor 1201, the variable current source 1200, and the resistor 1203 are identical to those in FIG. 18, and explanation therefore will be omitted for brevity. The resistor 1207 may comprise a first end, and a second end coupled to the third end of the transistor 1201. The transistor 1206 may comprise a first end coupled to the second end of the resistor 1203, a second end coupled to the first end of the resistor 1207, and a third end coupled to the reference potential terminal 30. The reference potential terminal 30 may receive the reference potential Vref5. In some embodiments, the transistor 1206 may be a MOSFET, a BJT, or other types of transistors.

The amplifier devices 2 in FIGS. 12 and 17 to 19 employ the variable current source 1200 in FIGS. 15 and 16 may generate a bias current Ibias to compensate for the source voltage variations, input or output signal power variations, ambient temperature variations, and/or amplifying unit temperature variations, thereby enhancing the performance of the amplifier devices 2. In some embodiments, the reference power module 122 in FIGS. 1 and 6 may be implemented by the variable current sources 1200 in FIGS. 15 and 16.

The amplifier devices as provided in some of the preset disclosure are capable of output adjustment for bias modules according to different linearity factors, and are capable of bias compensation for amplifier devices according to the voltage value of a voltage source, the frequency value of an input signal or a temperature value. The other amplifier devices as provided in some of the preset disclosure are capable of impedance adjustment according to a power of the input signal, a power of the output signal or an operation mode of the amplifying unit. Therefore, the linearity or the tendency of the power-gain curve or the power-phase curve of an amplifier device may be adjusted accordingly to meet with practical demands. Furthermore, the other amplifier devices as provided in some of the preset disclosure are capable of bias current adjustment for bias modules according to different various factors, and are capable of source voltage compensation, signal power compensation, ambient temperature compensation, and/or the amplifying unit temperature compensation for amplifier devices, thereby enhancing the performance of the amplifier devices.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier device comprising:
   an amplifying unit having a first end coupled to a voltage source configured to receive a source voltage, a second end configured to receive an input signal, and a third end coupled to a first reference potential terminal configured to receive a first reference potential, wherein the first end of the amplifying unit is configured to output an output signal amplified by the amplifying unit; and
   a bias module coupled to the second end of the amplifying unit, and configured to receive a voltage signal to generate a bias current according to a first counter-gradient and a second counter-gradient, and provide the bias current to the amplifying unit, wherein the voltage signal is a variable voltage, the voltage signal is substantially positively correlated to the source voltage, and the first counter-gradient and the second counter-gradient are negatively correlated to the voltage signal;
   wherein a supply current flowing into the amplifying unit is adjusted in accordance with the voltage signal to stay within a predetermined range;
   when the source voltage is less than a predetermined value, a relationship between the supply current and the source voltage is approximated by a first line segment;

when the source voltage is greater than the predetermined value, the relationship between the supply current and the source voltage is approximated by a second line segment;
the first line segment has a first gradient;
the second line segment has a second gradient;
the first counter-gradient is negatively correlated to the first gradient; and
the second counter-gradient is negatively correlated to the second gradient.

2. The amplifier device of claim 1, wherein:
when the source voltage is less than the predetermined value, the bias module is configured to provide the bias current according to the first counter-gradient; and
when the source voltage is greater than the predetermined value, the bias module is configured to provide the bias current according to the second counter-gradient.

3. The amplifier device of claim 1, wherein the bias module comprises a variable current source.

4. The amplifier device of claim 3, wherein the variable current source comprises:
an operational amplifier comprising a first input end coupled to a first signal terminal and configured to receive a first reference signal, a second input end coupled to a second signal terminal and configured to receive the voltage signal, and an output end configured to output an output voltage;
a first resistor comprising a first end coupled to the second input end of the operational amplifier, and a second end coupled to the output end of the operational amplifier; and
a voltage-to-current convertor comprising a first end coupled to the output end of the operational amplifier, and a second end coupled to the second end of the amplifying unit, and configured to convert the output voltage into the bias current.

5. The amplifier device of claim 4, wherein the variable current source further comprises:
a second resistor comprising a first end coupled to the first signal terminal, and a second end coupled to the first input end of the operational amplifier; and
a third resistor comprising a first end coupled to the second signal terminal, and a second end coupled to the second input end of the operational amplifier.

6. The amplifier device of claim 5, wherein the second resistor and the third resistor are variable resistors.

7. The amplifier device of claim 5, wherein the variable current source further comprises:
a first resistor selection circuit comprising a first end coupled to the first signal terminal, and a second end coupled to the first end of the second resistor; and
a second resistor selection circuit comprising a first end coupled to the second signal terminal, and a second end coupled to the first end of the third resistor.

8. The amplifier device of claim 7, wherein:
the first resistor selection circuit comprises:
a first switch comprising a first end coupled to the first end of the first resistor selection circuit, a second end coupled to the second end of the first resistor selection circuit, and a control end; and
a fourth resistor coupled between the first end of the first switch and the second end of the first switch; and
the second resistor selection circuit comprises:
a second switch comprising a first end coupled to the first end of the second resistor selection circuit, a second end coupled to the second end of the second resistor selection circuit, and a control end; and
a fifth resistor coupled between the first end of the second switch and the second end of the second switch.

9. The amplifier device of claim 5, wherein the variable current source further comprises:
a sixth resistor comprising a first end coupled to a third signal terminal and configured to receive a power signal; and a second end coupled to the first input end of the operational amplifier; and
a seventh resistor comprising a first end coupled to a fourth signal terminal and configured to receive a second reference signal; and a second end coupled to the second input end of the operational amplifier;
wherein the second reference signal is a fixed voltage independent of power variations of the input signal or the output signal; and
the output end of the operational amplifier is further configured to output the output voltage according to the power signal and the second reference signal.

10. The amplifier device of claim 5, wherein the variable current source further comprises:
an eighth resistor comprising a first end coupled to a fifth signal terminal and configured to receive a first temperature signal; and a second end coupled to the first input end of the operational amplifier; and
a ninth resistor comprising a first end coupled to a sixth signal terminal and configured to receive a third reference signal; and a second end coupled to the second input end of the operational amplifier;
wherein the third reference signal is a fixed voltage independent of temperature variations; and
the output end of the operational amplifier is further configured to output the output voltage according to the first temperature signal and the third reference signal.

11. The amplifier device of claim 5, wherein the variable current source further comprises:
a tenth resistor comprising a first end coupled to a seventh signal terminal and configured to receive a second temperature signal; and a second end coupled to the first input end of the operational amplifier; and
an eleventh resistor comprising a first end coupled to an eighth signal terminal and configured to receive a third temperature signal; and a second end coupled to the second input end of the operational amplifier;
wherein the output end of the operational amplifier is further configured to output the output voltage according to the second temperature signal and the third temperature signal.

12. The amplifier device of claim 5, wherein the variable current source further comprises:
a twelfth resistor comprising a first end coupled to a ninth signal terminal and configured to receive a fourth reference signal; and a second end coupled to the first input end of the operational amplifier; and
a thirteenth resistor comprising a first end coupled to a second reference potential terminal and configured to receive a second reference potential;
and a second end coupled to the second input end of the operational amplifier;
wherein the fourth reference signal is a fixed voltage independent of voltage variations of the source voltage; and
the output end of the operational amplifier is further configured to output the output voltage according to the fourth reference signal and the second reference potential.

13. The amplifier device of claim 5, wherein the variable current source further comprises a fourteenth resistor comprising a first end coupled to the first end of the first resistor, and a second end coupled to a third reference potential terminal.

14. The amplifier device of claim 4, wherein the first input end of the operational amplifier is a non-inverting end, and the second input end of the operational amplifier is an inverting end.

15. The amplifier device of claim 4, wherein the operational amplifier is an adder.

16. The amplifier device of claim 3, wherein the bias module further comprises a first transistor comprising a first end coupled to a bias voltage source, a second end coupled to the variable current source, and a third end coupled to the second end of the amplifying unit.

17. The amplifier device of claim 1, wherein the amplifying unit is a power amplifier.

\* \* \* \* \*